(12) United States Patent
Goodman et al.

(10) Patent No.: US 9,117,856 B2
(45) Date of Patent: *Aug. 25, 2015

(54) SUBSTRATE LOADER AND UNLOADER HAVING AN AIR BEARING SUPPORT

(75) Inventors: Daniel Goodman, Lexington, MA (US); Arthur Keigler, Wellesley, MA (US); Freeman Fisher, Charlestown, MA (US)

(73) Assignee: TEL NEXX, INC., Billerica, MA (US)

( * ) Notice: Subject to any disclaimer, the term of this patent is extended or adjusted under 35 U.S.C. 154(b) by 870 days.

This patent is subject to a terminal disclaimer.

(21) Appl. No.: 13/279,414

(22) Filed: Oct. 24, 2011

(65) Prior Publication Data

US 2013/0009415 A1 Jan. 10, 2013

Related U.S. Application Data

(60) Provisional application No. 61/504,920, filed on Jul. 6, 2011, provisional application No. 61/504,942, filed on Jul. 6, 2011, provisional application No. 61/527,222, filed on Aug. 25, 2011.

(51) Int. Cl.
*A47J 45/00* (2006.01)
*H01L 21/67* (2006.01)
*H01L 21/683* (2006.01)
*H01L 21/687* (2006.01)

(52) U.S. Cl.
CPC ...... *H01L 21/67092* (2013.01); *H01L 21/6838* (2013.01); *H01L 21/68764* (2013.01); *H01L 21/68785* (2013.01)

(58) Field of Classification Search
CPC . B66C 1/02; H01L 21/67778; H01L 21/6838; H01L 21/68707; H01L 21/67769; H01L 21/67092; H01L 21/68764; H01L 21/68785; B62D 57/032; B25J 9/1697; B65G 47/91; B65G 51/03; B25B 5/061; B25B 11/005; B65H 3/48; G03F 7/70716; D06F 58/22; B05B 13/0242

See application file for complete search history.

(56) References Cited

U.S. PATENT DOCUMENTS

| | | | |
|---|---|---|---|
| 751,699 A | 2/1904 | Teeter et al. | |
| 4,566,726 A | 1/1986 | Correnti et al. | |
| 4,778,332 A | 10/1988 | Byers et al. | |
| 5,067,762 A | 11/1991 | Akashi | |
| 5,547,415 A * | 8/1996 | Hasegawa et al. | 451/44 |
| 6,379,103 B1 | 4/2002 | Okugi | |
| 6,517,130 B1 | 2/2003 | Donoso et al. | |
| 6,631,935 B1 | 10/2003 | Casarotti et al. | |
| 6,648,974 B1 * | 11/2003 | Ogliari et al. | 118/719 |
| 6,688,662 B2 | 2/2004 | Casarotti et al. | |
| 6,824,613 B2 * | 11/2004 | Dai et al. | 118/72 |
| 6,896,304 B2 * | 5/2005 | Li et al. | 294/185 |
| 6,948,898 B2 | 9/2005 | Berger et al. | |
| 7,022,211 B2 | 4/2006 | Yoshioka et al. | |

(Continued)

*Primary Examiner* — Stephen Vu
(74) *Attorney, Agent, or Firm* — Rothwell, Figg, Ernst & Manbeck, P.C.

(57) ABSTRACT

A substrate separation chuck which is adapted to separate a substrate from an adhering surface. The substrate separation chuck has a support adapted to support the adhering surface. An air bearing surface is adapted to support the substrate, the air bearing surface axially moveable relative to the support. The air bearing surface has a first position adjacent the substrate with the substrate coupled to the adhering surface. The air bearing surface is moveable from the first position to a second position separating the substrate from the adhering surface without contact between the substrate and the air bearing surface.

10 Claims, 19 Drawing Sheets

(56) References Cited

U.S. PATENT DOCUMENTS

| | | |
|---|---|---|
| 7,100,954 B2 | 9/2006 | Klein et al. |
| 7,104,579 B2 | 9/2006 | Casarotti et al. |
| 7,144,056 B2 | 12/2006 | Casarotti et al. |
| 7,445,697 B2 | 11/2008 | Keigler et al. |
| 7,543,867 B2 | 6/2009 | Pun et al. |
| 7,607,647 B2 | 10/2009 | Zhao et al. |
| 7,690,869 B2 * | 4/2010 | Yo et al. ............ 406/88 |
| 7,823,941 B2 | 11/2010 | Caldwell et al. |

* cited by examiner

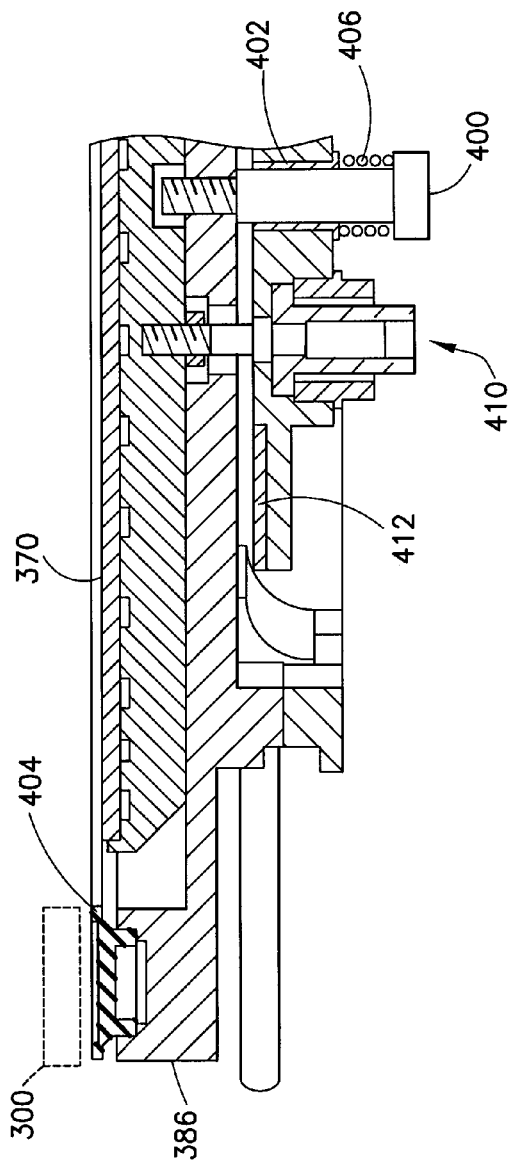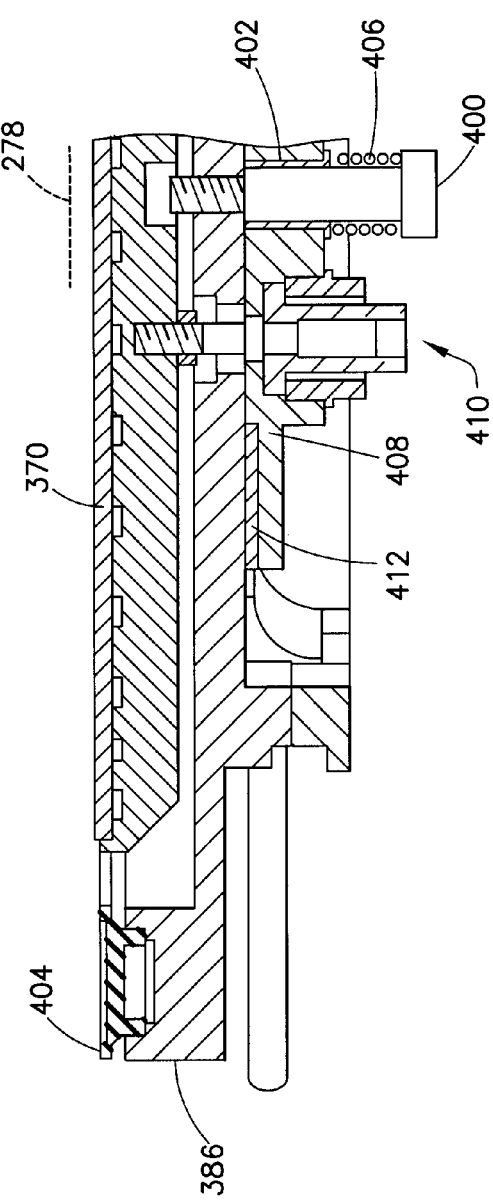

SUBSTRATE LOADER AND UNLOADER HAVING AN AIR BEARING SUPPORT

RELATED APPLICATIONS

This application claims the benefit of and priority from U.S. Provisional Patent Application Ser. No. 61/504,920 Entitled "SUBSTRATE LOADER AND UNLOADER HAVING AN AIR BEARING SUPPORT", filed on Jul. 6, 2011, U.S. Provisional Patent Application Ser. No. 61/504,942 Entitled "SUBSTRATE LOADER AND UNLOADER HAVING A BERNOULLI SUPPORT" filed on Jul. 6, 2011 and U.S. Provisional Patent Application Ser. No. 61/527,222 Entitled "SUBSTRATE LOADER AND UNLOADER", filed on Aug. 25 2011, which are hereby incorporated by reference herein in their entireties and is further related to U.S. patent application Ser. No. 13/279,405, filed Oct. 24, 2011, now U.S. Pat. No. 8,613,474, issued Dec. 24, 2013 and U.S. patent application Ser. No. 13/279,432, filed Oct. 24, 2011, now U.S. Pat. No. 8,967,935, issued Mar. 3, 2015.

BACKGROUND

1. Field

The disclosed embodiments relate generally to a substrate loader and unloader and more specifically to a substrate loader and unloader having a non-contact substrate support securing and supporting the substrate with gas pressure.

2. Brief Description of Related Developments

Fluid processing, among other processes, is used as a manufacturing technique for the application or removal of films and materials to various structures and surfaces, such as semiconductor wafers and silicon work pieces or substrates of varying materials. Fluid processing may require sealing or placing a substrate against for example an elastomeric surface during processing and subsequently removing the substrate from the elastomeric surface after one or more processing steps have been completed. Further, substrate processing may be done in a clean environment and requiring clean processing and transport.

A problem arises when processing and transporting substrates in a clean environment where particulates and other contamination or damage may occur to the substrate by virtue of the process and/or transport method. Accordingly, there is a desire to provide fluid processing and transport of substrates while minimizing contamination and damage to the substrate.

BRIEF DESCRIPTION OF THE DRAWINGS

The foregoing aspects and other features of the embodiments are explained in the following description, taken in connection with the accompanying drawings.

FIG. 13 shows a retracted air bearing chuck;
FIG. 14 shows an extended air bearing chuck.

DETAILED DESCRIPTION OF THE EMBODIMENTS

Figure 1:
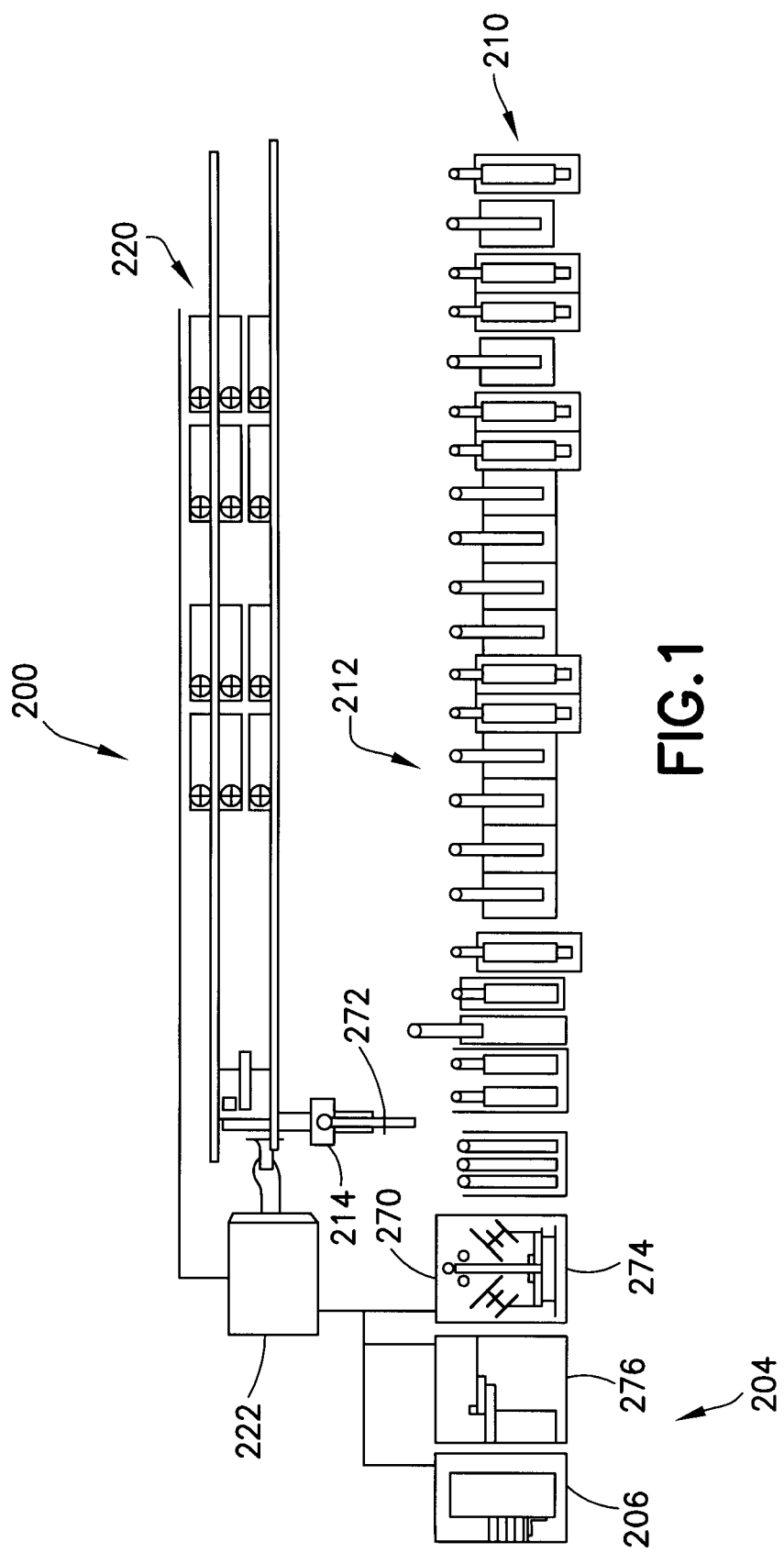
FIG. 1 shows an exemplary wafer processing system.

Although the present embodiments will be described with reference to the embodiments shown in the drawings, it should be understood that the embodiments can be embodied in many alternate forms of embodiments. In addition, any suitable size, shape or type of elements or materials could be used.

Figure 2:
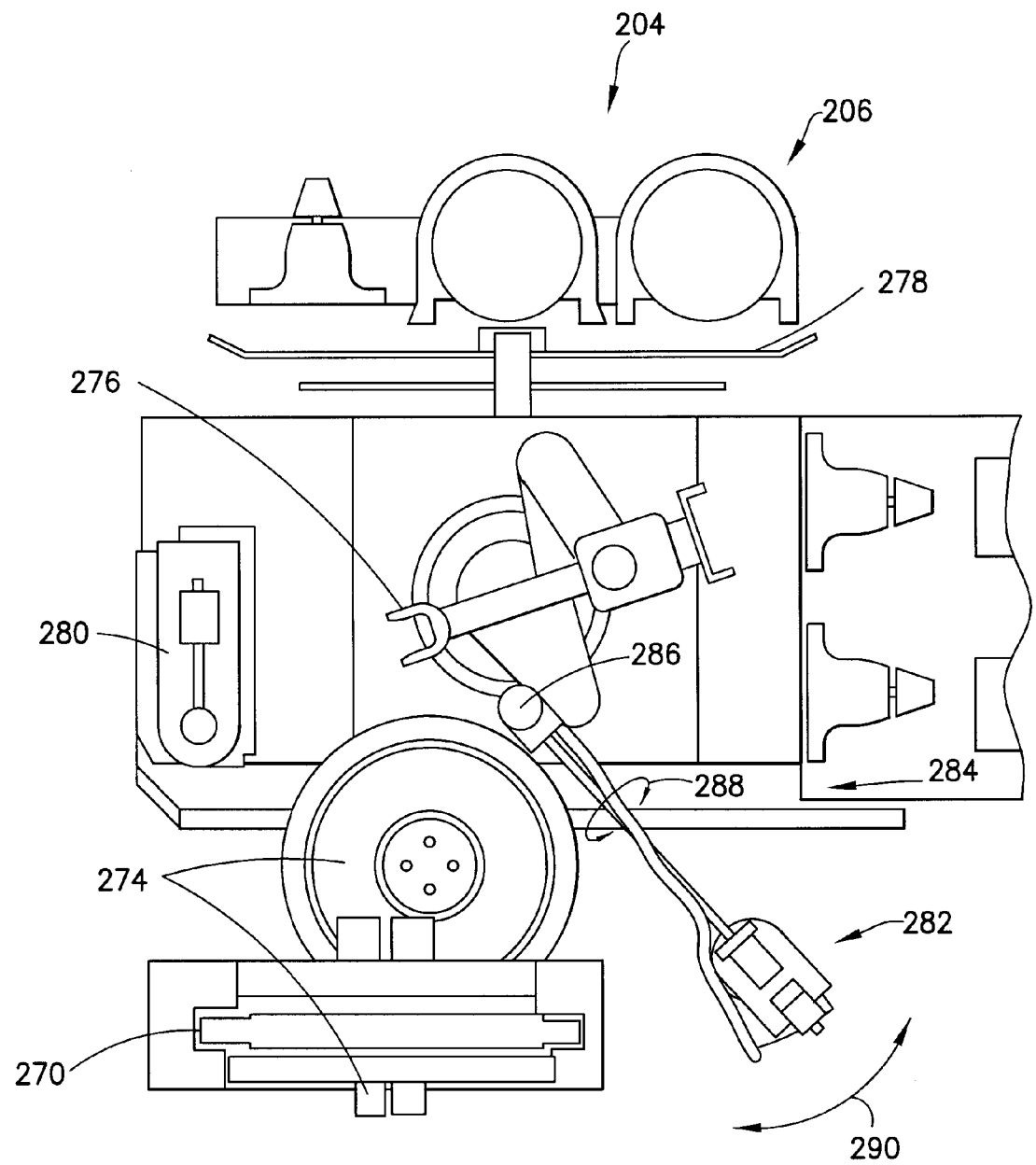
FIG. 2 shows a front end loading and unloading portion of an exemplary wafer processing system.

Referring now to FIG. 1, there is shown an exemplary wafer processing machine 200 suitable for a manufacturing process using the present disclosed embodiments. Referring also to FIG. 2, there is shown a front end loading and unloading portion 204 of an exemplary wafer processing system 200. The disclosed embodiments may be implemented in an electroplating, cleaning or etching system and may be used in combination with an electro deposition machine such as the Stratus from NEXX Systems in Billerica Mass. System 200 and modules 210 may incorporate features as disclosed in the International Application WO 2005/042804 A2 published under the Patent Cooperation Treaty and having publication date May 12, 2005 and as disclosed in U.S. Publication No. 2005/0167275 published Aug. 14, 2005 and entitled method and apparatus for fluid processing a work piece, both of which are hereby incorporated by reference herein in their entirety. System 200 is shown as an exemplary system. In alternate embodiments, more or less modules may be provided having different configurations and locations. Machine 200 may contain load ports 206 by which substrates previously processed, such as being patterned with photoresist or otherwise processed are inserted and withdrawn from the system. Loading station 204 may have a robotic arm 276 which may selectively transfer substrates 278 to pre aligner 280, pick up and flip device 282 or buffer module 284. Pick up and flip device 282 has one or more vacuum chuck(s) 286 to grip the backside of substrate 278 and also has first 288 and second 290 rotation axis in addition to a vertical z axis to respectively invert and transport substrate 278 to and from wafer loader module 274 where wafer loader module 274 may load wafer(s) to holders 270, 272. Here, loader module 274 may have features as further described below and for gripping and un gripping one or more wafers either in parallel or selectively of holder 270. In alternate embodiments, robotic arm 276 may transport a single wafer, a batch of wafers or a combination thereof. In alternate embodiments, more than one loader module 274 may be provided to load holders 270, 272 in parallel or to load wafers onto different types of holders for different types of processes. Although loader 274 will be described below in greater detail, it is understood that the disclosed embodiment chucks may be used in any suitable loading, unloading, transport or processing module(s). An example of holder 270 is disclosed in U.S. Pat. No. 7,445,697 Issued Nov. 4, 2008 and entitled Method and Apparatus for Fluid Processing a Work Piece which is hereby incorporated by reference in its entirety. In alternate embodiments, any suitable combination of holder(s) may be utilized within system 200. Process modules 210 may have features, for example, where modules 210 may be suitable for electroplating wafers, anodizing wafers, cleaning wafers, such as liquid stripping of photoresist, seed layer etching, general wafer cleaning or otherwise. By way of further example, in operation, cassettes (or FOUPs) of wafers are loaded into system 200 at front end 204, individual wafers are loaded onto wafer holders 270 that hold wafers during processing where wafers, mounted in wafer holders, are transported within the wet process area 212 by wafer transporter 214. In wet-process area 212 wafers may be transferred through pre-treatment, rinse, and a sequence of alternating plating and rinsing steps or otherwise as defined by recipes. Controller(s) 220 may be provided within each station or module to sequence the process and/or transport within the station or module. A system controller(s) 222 may be provided within the system 200 to sequence substrates between the stations or process modules and to coordinate system actions, such as, host communication, lot loading and unloading or otherwise those actions that are required to control the system 200. In alternate embodiments, process modules 210 may include a combination of cleaning and electro deposition modules. In alternate embodiments, more or less modules in more or less suitable combinations may be provided in any suitable combination. As such, all such variations, alternatives and modifications of system 200 configurations are embraced.

Figure 3:
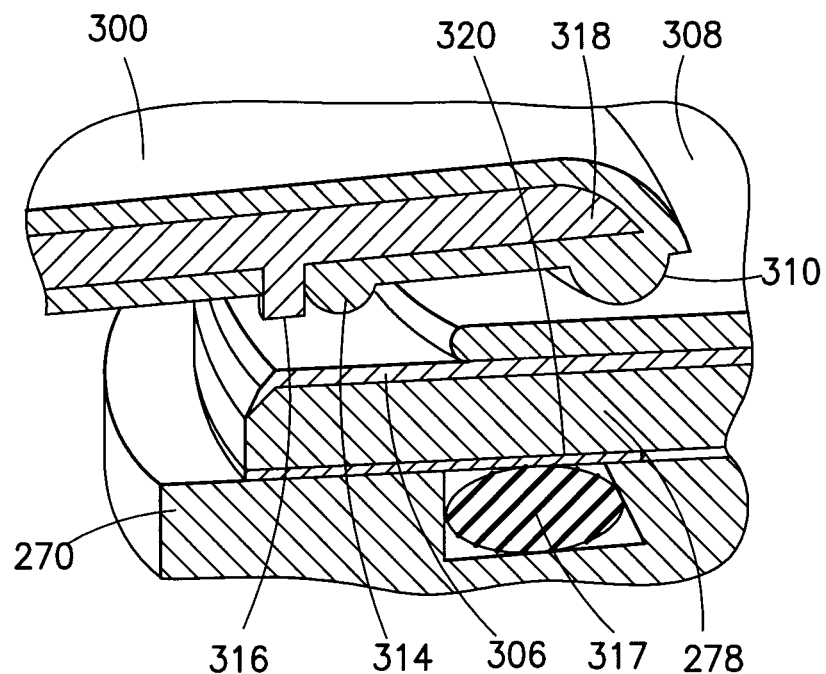
FIG. 3 shows a contact ring seal.
Figure 4:
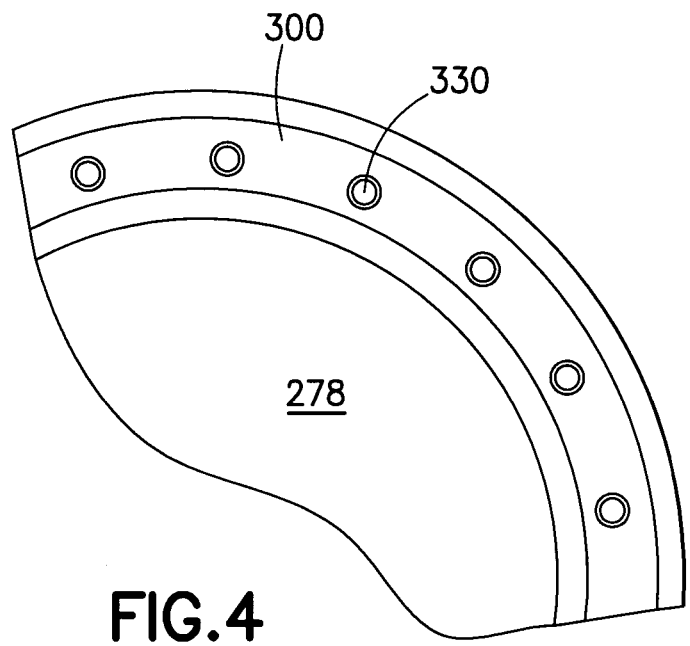
FIG. 4 shows a contact ring seal.
Figure 5:
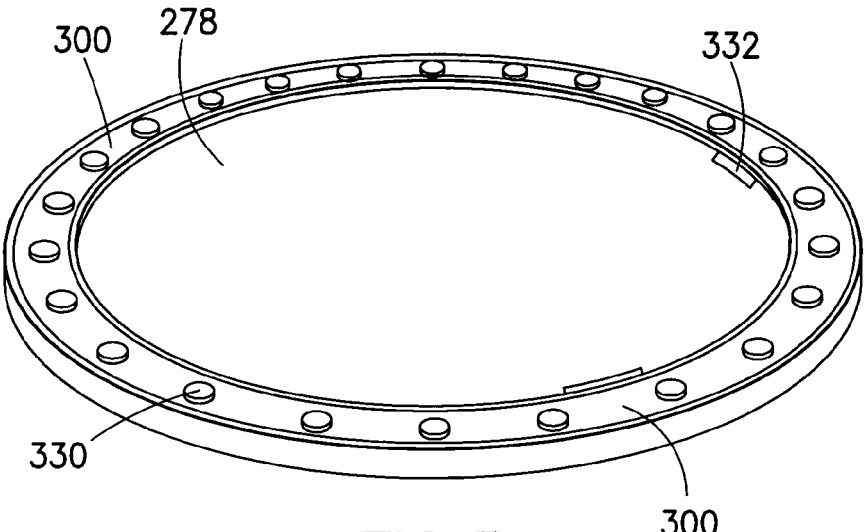
FIG. 5 shows a contact ring seal.

Referring now to FIG. 3, there is shown an exemplary sealing portion referred to herein for description purposes as a contact ring seal 300. Referring also to FIG. 4, there is also shown contact ring seal 300. Referring also to FIG. 5, there is also shown contact ring seal 300. As may be realized, the contact ring seal is configured to be coupled to the holder frame and capture the substrate to the holder. A suitable example of a contact ring seal is described and shown in U.S. Pat. No. 6,540,899, Issued Apr. 1, 2003. In alternate embodiments any suitable contact ring seal may be used. In the embodiment shown, substrate 278 may have seed layer 306 and resist layer 308. With respect to FIG. 3, contact ring seal 300 is assembled to and coupled to holder 270 where contact ring seal 300 seals with primary seal 310 to photoresist layer 308 and secondary seal 314 to seed layer 306 where the seal material may be Viton® or any suitable material. Spaced electrical contacts 316 distribute electrical contact evenly around the circumference of wafer 278 and may provide a mechanism 318 to axially stiffen contact ring seal 300 for effective sealing of seal 310 where contacts 316 may be substantially embedded within the Viton® or otherwise.

Figure 6A:
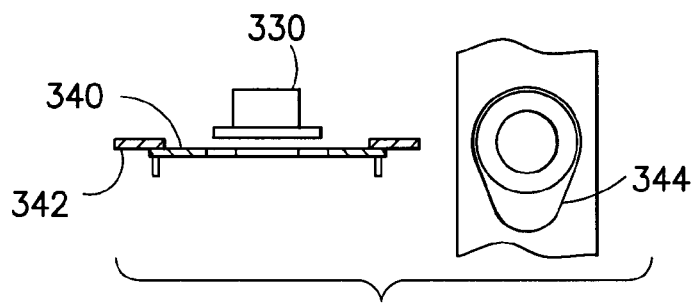
FIG. 6A shows a contact ring seal lock pin and spring plate.
Figure 6B:
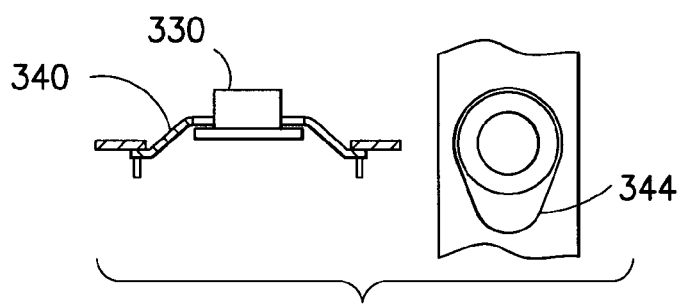
FIG. 6B shows a contact ring seal lock pin and spring plate.
Figure 6C:
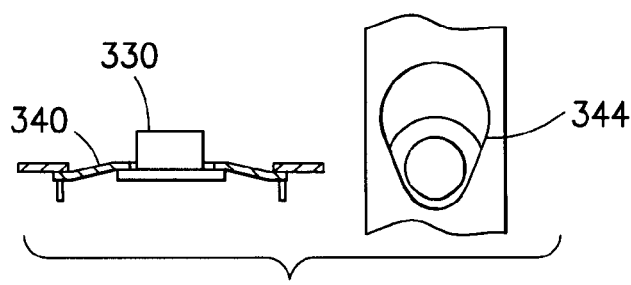
FIG. 6C shows a contact ring seal lock pin and spring plate.

O-ring 317 may be provided within holder 270 to provide an additional seal on the wafer backside around the circumference of wafer 278 within edge exclusion zone 320. Lock pins 330 may be provided around the circumference of contact ring seal 300 where lock pins 330 engage key holes in holder 270 as will be described in greater detail below. One or more alignment bosses 332 may be provided on contact ring seal 300 to provide alignment, for example as shown with respect to FIG. 5, where, for example, substrate 278 is supported by a non-contact wafer support or chuck, that may be referred to herein for description purposes as an air bearing chuck as will be described, and tilted or otherwise to drive substrate 278 against alignment bosses 332. In operation, one or more wafers 278 may be mounted to wafer holder 270 by a temporary, leak-proof seal 310 around the full circumference of wafer 278 where the sealing force may be created by a flexure, for example, an annular spring or otherwise. In the exemplary embodiment where springs 340, as seen in FIG. 6A-6C, may be embedded within each wafer holder 270 where spring force may be maintained locally inside each wafer holder independent of the rest of the process tool. Here, wafers 278 may remain sealed to wafer holders 270 during all phases of processing. In the embodiment shown, sealing may be 100% tested prior to processing. Here machined features may be provided on wafer holder 270 to positively align wafers as they are presented to each process module where no additional physical adjustment may be required once inserted into a module. In the embodiment shown, wafer holder 270 may provide a source of gripping wafers for transport that avoids contact with the wafer surface where wafer holder 270 in cooperation with contact ring seal 300 may act as the active cathode during electrochemical deposition (ECD) or otherwise.

Referring now to FIG. 6A, there is shown a contact ring seal lock pin and spring plate. Referring also to FIG. 6B, there is shown a contact ring seal lock pin and spring plate. Referring also to FIG. 6C, there is shown a contact ring seal lock pin and spring plate. In the embodiment shown, spring plate 342 is provided within holder 270 where spring plate has flexures 340 and keyholes 344 that engage lock pins 330 in contact ring seal 300. In FIG. 6A, lock pin 330 is aligned with a portion of keyhole 344 that has clearance to allow keyhole 344 to axially move past the shoulder of lock pin 330 when air pressure or otherwise within holder 270 expands flexures 340 of spring plate 340 as seen in FIG. 6B. As seen in FIG. 6C, contact ring seal 300 may be rotated by loader 274 as will be described below to engage a portion of keyhole 344 that interferes with the shoulder of lock pin 330 where flexures 340 axially preload the seals associated with contact ring seal 300 when air pressure is relieved allowing spring plate 342 to retract engaging the key holes 344 with the shoulders of lock pins 330 thus retaining substrate 278 within holder 270 during transport and processing.

Figure 7:
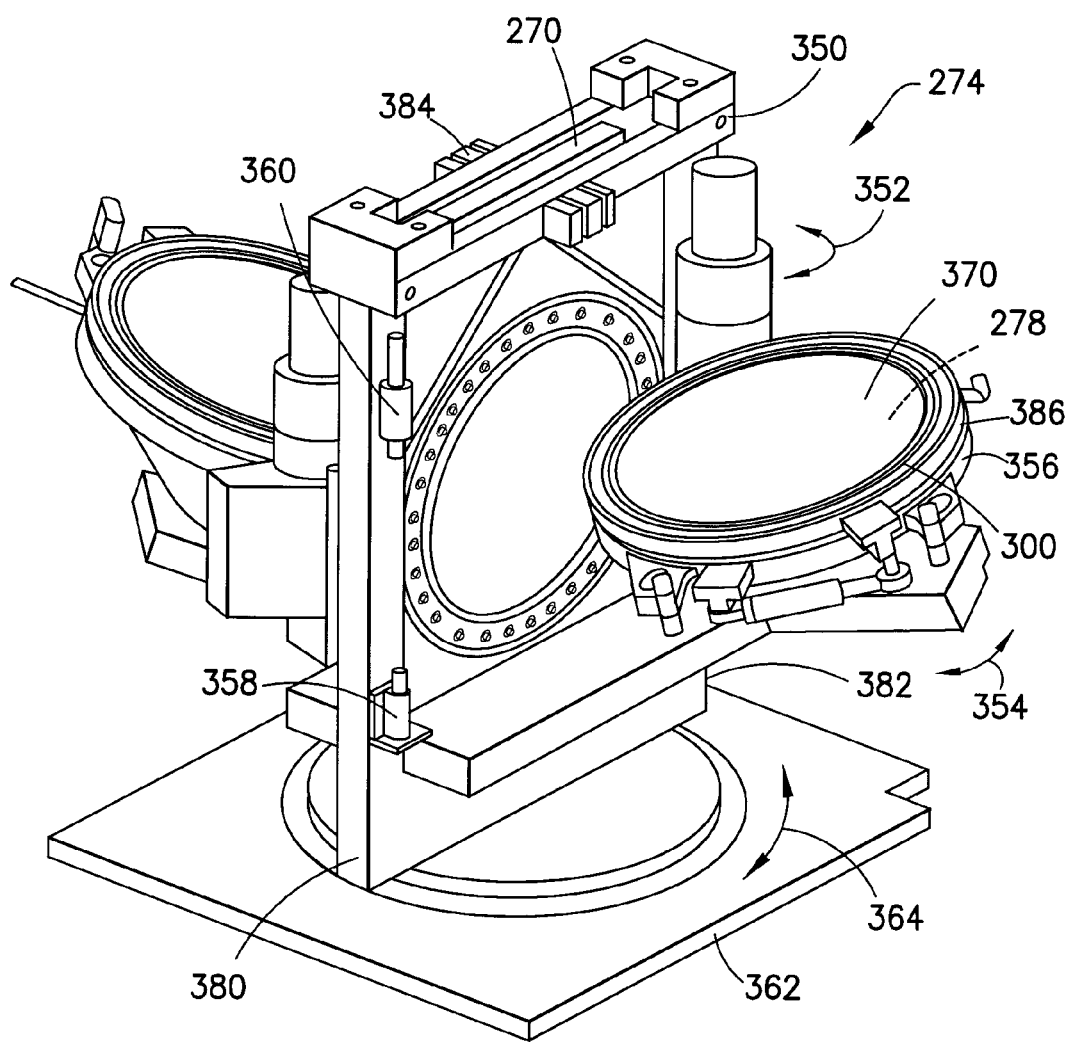
FIG. 7 shows an auto loader and unloader.

Referring now to FIG. 7, there is shown an exemplary auto loader and unloader 274 and exemplary holder 270. Autoloader 274 may mount individual wafers onto wafer holders before they are processed and may dismount wafers after processing is complete. In the embodiment shown, holder 270 may hold two substrates on opposing sides of holder 270 where loader 274 may have two opposing loading and unloading features as shown. By way of example, coupled to frame 350 may be swing axis 352, tilt axis 354 perpendicular to swing axis 352, door assembly 356 and door clamps 358, 360 where frame 350 may have guidance and locating features, such as align strips 380, 382 to positively locate holder 270 with respect to frame 350. As will be described in greater detail below, chuck assembly 370 may be provided within door assembly 356 where the combination of door assembly and chuck assembly 370 may have one or more features allowing chuck assembly to be axially moved relative to tilt axis 354. Frame 350 may be rotationally coupled to base 362 by spin axis 364. In the embodiment shown, each of the respective axis may be servo controlled or otherwise controlled to selectively position chuck assembly 370 with respect to base 362 and holder 270. In the embodiment shown, loader 274 is merely exemplary where, by way of example, the features of chuck 370 and/or door 356 may be used in any suitable handling, transport or process application or otherwise. In the embodiment shown, loader 274 may use chuck 370 that handles substrates in a noncontact fashion as described below, for example, during transport and during engagement and disengagement with contact ring seal 300 and holder 270 where chuck 370 facilitates desticking of seals without contact between substrate 278 and chuck 370. Here, chuck assembly 370 mounts into door assembly 356 where door assembly 356 handles both the wafer and contact ring seal interface. In the embodiment shown, door assembly 356 may functionally align wafers against an alignment feature, for example, on seal, alignment bosses or otherwise. Further door assembly 356 may functionally hold the wafer in a fixed location while being loaded onto the holder via the loader and may engage/disengage and lock/unlock the contact ring seal with respect to the wafer holder. In operation, tilt axis 354 rotates substrate 278 from a horizontal attitude to a vertical attitude where swing axis 352 rotates door assembly 356 into a position with chuck 370 parallel to the wafer or contact ring seal engagement surface of holder 270. The position of door assembly 356 is locked with respect to frame 350 where two cylinders or other suitable devices 358, 360 on align strip 380 opposing align strip 382 engage door assembly 356 forming a rigid three point coupling between the align strips 380, 382 and door assembly 356. An exemplary loading operation begins where transporter 214 loads holder 270 having a wafer into frame 350 and a service connection 384 for air, nitrogen or otherwise is actuated. With door assembly 356 in the vertical position locked by features 358, 360, vacuum ring 386 and chuck 370 within door 356 are axially moved toward holder 270 where vacuum ring 386 grips contact ring seal 300. The spring plate within holder 270 is actuated and vacuum ring 386 and chuck 370 within door 356 are rotated to disengage the lock pins from the keyholes. Vacuum ring 386 and chuck 370 within door 356 are axially moved away from holder 270 where vacuum ring 386 extracts contact ring seal 300 from holder 270 and where chuck 370 extracts substrate 278 from holder 270 without contact. In the exemplary embodiment controller 222 may be programmed so that vacuum ring 386 and chuck 370 may effect extraction of the contact seal ring and substrate 278 together as a unit from the holder 270, as will be described further below. Clamps 358, 360 are released and the door assembly rotated by swing axis 352 and rotated to a horizontal attitude by tilt axis 354. As will be described, substrate 278 is separated from contact ring seal 300 in a destick operation effected by the controller without chuck 370 contacting substrate 278 by moving chuck 370 axially relative to vacuum ring 386 separating substrate 278 from contact ring seal 300. In operation, during load and unload sequences, chuck 370 may be angled with respect to horizontal, for example, to provide for alignment of substrate 278 with alignment bosses 332 on contact ring seal 300. Pick up and flip device 282 removes a processed or dummy substrate 278 from loader 274 and may provide an unprocessed or other substrate for loading where the loading sequence may be opposite the unloading sequence or otherwise. The disclosed embodiments overcome seal to wafer interface stiction in the loader with chuck 370 that may alternately be applied elsewhere and in other applications where chuck 370 may be applied to overcome adhesion forces between the wafer and contact ring seal that seals the peripheral edge of the wafer within the edge exclusion zone and isolates the backside of the wafer from process chemistry during processing. Here, wafers may tend to stick to the seal (stiction) and may pop or create particles when the two are improperly separated and disengaged. The disclosed embodiments may be applied generally to sealing surfaces and substrates.

Figure 8:
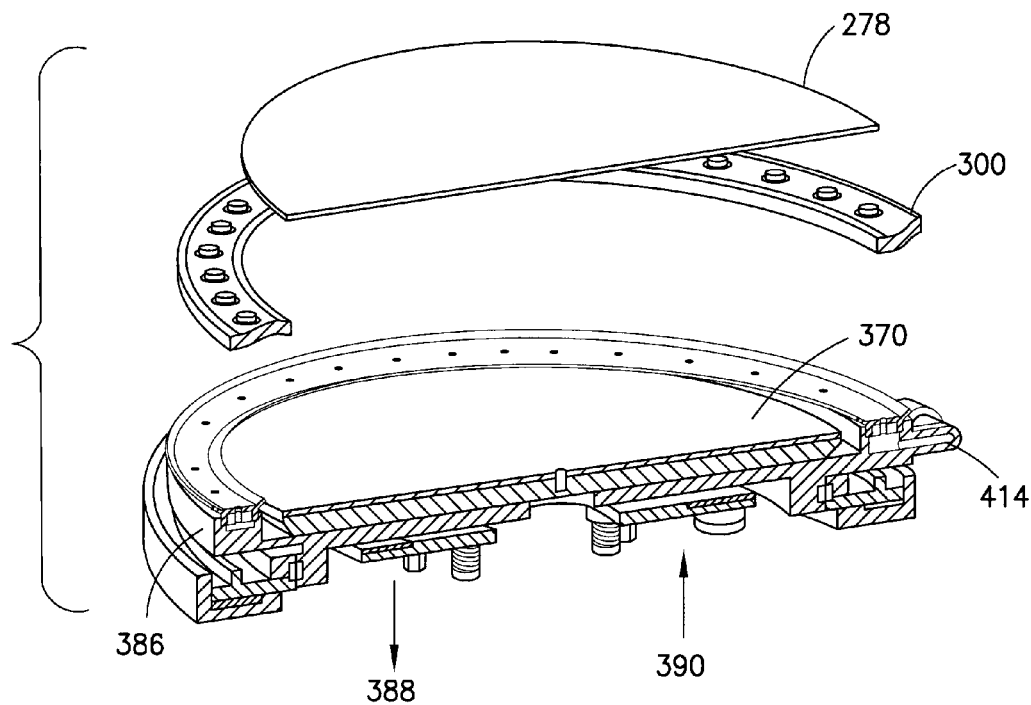
FIG. 8 shows a cross section of an air bearing chuck.

Referring now to FIG. 8, there is shown a section view of an air bearing chuck 370 with vacuum ring 386. In the embodiment shown and as will be described in greater detail below, the surface of chuck 370 has regions of vacuum and air bearing pressure where vacuum 388 may be selectively switched on and off to selectively attract wafer 278 and where pressure may selectively be switched on and off to selectively float or repel wafer 278. Further, vacuum ring 386 has vacuum port 414 where vacuum may selectively be switched on and off to selectively attract contact ring seal 300. In the exemplary embodiment, an exemplary process flow for wafer holder loader 270 loading and unloading where chuck 370 does not contact substrate 278 via combination air bearing (selective gas pressure on and off) and vacuum (selective vacuum on and off) of chuck 370 may be as follows:

Wafer 278 placement onto contact ring seal (CRS) 300: With vacuum ring 386 vacuum on and chuck 370 vacuum and gas off and with tilt axis 354 rotated such that chuck 370 is in a horizontal and retracted attitude (e.g. down or inward) and with contact ring seal 300 held with vacuum ring 386, wafer 278 is placed on chuck 370 and contact ring seal 300 via pick up and flip device 282 (as described before) or otherwise.

Wafer Float: With chuck 370 gas on and vacuum off, chuck 370 (under suitable control from the controller 222) extends supporting substrate 278 in a non contact fashion.

Tilt: With chuck 370 gas on and vacuum off, tilt axis 354 is rotated 15 degrees or otherwise using gravity to float substrate against ring seal alignment bosses 332 where upon completion of the tilting motion, chuck 370 vacuum is then turned on.

Vertical: With chuck 370 gas on and vacuum on, tilt axis 354 is rotated to vertical.

Swing and Lock: With chuck 370 gas on and vacuum on, swing axis 352 is rotated such that contact ring seal 300 and substrate 278 are parallel with corresponding features on holder. Clamps 558, 360 are engaged locking door assembly 356 in position.

Shuttle in: With chuck 370 gas on and vacuum on, secondary bladder 552 (as will be described with respect to FIG. 29) is deflated causing contact ring seal 300 to engage holder 270 as in FIG. 6A.

Clamp stud engagement: With chuck 370 gas on and vacuum on, spring plate 340 is extended as in FIG. 6B. Here, the actual position of chuck 370 is determined by springs and the counter force of substrate 278 with respect to the air bearing surface of chuck 370.

Rotation and lock: With chuck 370 gas on and vacuum off, where spring plate 340 is extended as in FIG. 6B, chuck 370 and ring 300 are rotated to engage keyhole features 344 as shown in FIG. 6C and the spring plate 340 is retracted as in FIG. 6C locking the substrate 278 and contact ring seal 300 in a clamped position. Here, the actual position of chuck 370 is determined by springs and the counter force of substrate 278 with respect to the air bearing surface of chuck 370.

Shuttle out: With vacuum ring 386 vacuum off, secondary bladder 552 (as will be described with respect to FIG. 29) is inflated causing vacuum ring 386 to disengage contact ring seal 300 and chuck 370 to disengage substrate 278 where gas is then turned off. Unload sequence for the same substrate follows.

Shuttle in: With chuck 370 gas on and vacuum on, secondary bladder 552 (as will be described with respect to FIG. 29) is deflated causing contact vacuum ring to engage ring seal 300 on holder 270. Vacuum for vacuum ring 386 is turned on coupling contact ring seal 300 to vacuum ring 386. Here, the actual position of chuck 370 is determined by springs and the counter force of substrate 278 with respect to the air bearing surface of chuck 370.

Rotation and unlock: With chuck 370 gas on and vacuum on, contact ring seal is unlocked and rotated with respect to holder 270 as shown sequentially in FIG. 6C, FIG. 6B and FIG. 6A.

Shuttle out: With chuck 370 gas on and vacuum on and with vacuum ring 386 vacuum on, secondary bladder 552 (as will be described with respect to FIG. 29) is inflated causing contact ring seal 300 and chuck 370 with substrate 278 to disengage holder 270.

Unlock, Swing and Tilt Horizontal: Clamps 358, 360 are unclamped releasing door assembly 356 with respect to frame 350. With chuck 370 gas on and vacuum on, Swing axis 352 is rotated and tilt axis 354 rotated such that substrate 278 is in a horizontal attitude clear of holder 270.

Destick: With chuck 370 gas on and vacuum off and chuck 370 extended destick of substrate 278 with respect to seal 310 of contact ring seal 300 is accomplished.

Wafer Transfer: Chuck 370 is retracted with chuck gas subsequently switched off and with vacuum off, substrate 278 may be removed by pick up and flip device 282 or otherwise.

The process described above is merely exemplary and as may be realized the process may be accomplished in any suitable order and more for fewer actions. During an unload operation where substrate 278 is removed from holder 270 and where substrate 278 is separated from contact ring seal 300, wafer 278 may stick to the contact ring seal 300. This effect may be due to loss of anti-stick coating on the contact ring seal 300 or to chemical interactions between contact ring seal 300 Viton® and photo-resist on the wafer or otherwise as will be described in greater detail below. In the disclosed embodiments, an exemplary loader 274 system utilizes an air bearing chuck 370, in which the force between the air bearing surface and the wafer is sufficient to prevent contact between chuck surfaces and the wafer. Further, air bearing chuck 370 may be configured and controlled to prevent turbulent gas generation at the chuck surface, thereby reducing the potential for particles. Further, chuck 370 may use vacuum force during wafer holder unload. In the embodiments shown, air-bearing chuck 370 may be made of sintered material with small pore sizes. Such materials are available in carbon and silicon carbide composite or other suitable materials. By way of example, chuck 370 may be manufactured of porous graphite air bearings at the New Way Air Bearings Company of Aston Pa., with the permeability of graphite being adjusted to meet specific application requirements. To yield soft bearings that will not scratch interfacing components, the permeability adjustment may occur with a polymeric impregnation of the graphite. Similarly, to yield hard bearings that will not be damaged if contacted with interfacing components, the permeability adjustment may occur with a ceramic impregnation.

Figures 9, 10:
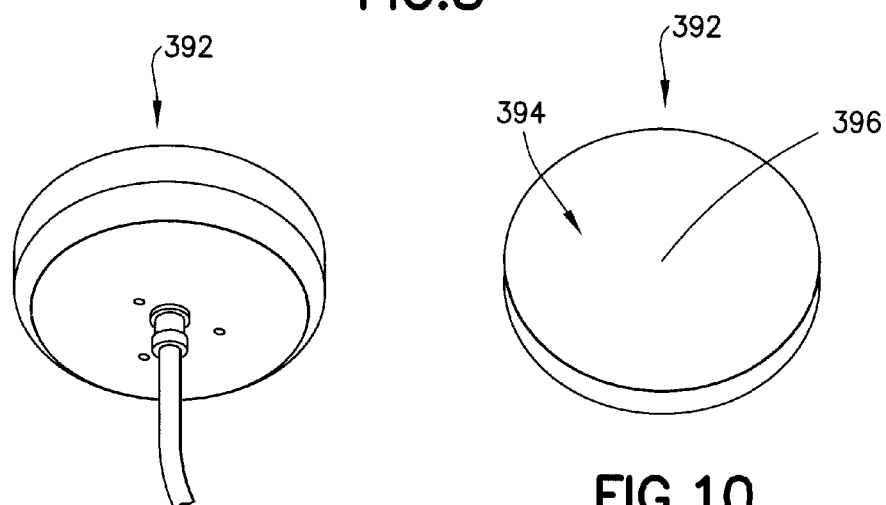
FIG. 9 shows an air bearing chuck.
FIG. 10 shows an air bearing chuck.

Referring now to FIG. 9, there is shown an exemplary air bearing chuck 392. Referring also to FIG. 10, there is shown an exemplary air bearing chuck 392. In the embodiment shown, chuck 392 has air-bearing chuck surface 394 with a central vacuum region or hole 396. In the embodiment shown, wafer chucking force may be adjusted, via controller 222, (see FIG. 1), by varying gas pressure on air-bearing chuck surface 394 and vacuum level at central vacuum region or hole 396. For example, a suitable combination of chucking and floating may use 10-20 psi of nitrogen pressure on air-bearing chuck surface 394 and about 600 Torr vacuum level at central vacuum region or hole 396. In alternate embodiments, other suitable pressure and vacuum levels may be provided. In alternate embodiments, more pressure regions, for example with different pressures or porosity may be provided at different locations on chuck 392. In alternate embodiments, more vacuum regions may be provided with the same or different vacuum levels or at different locations on chuck 392.

Figure 11:
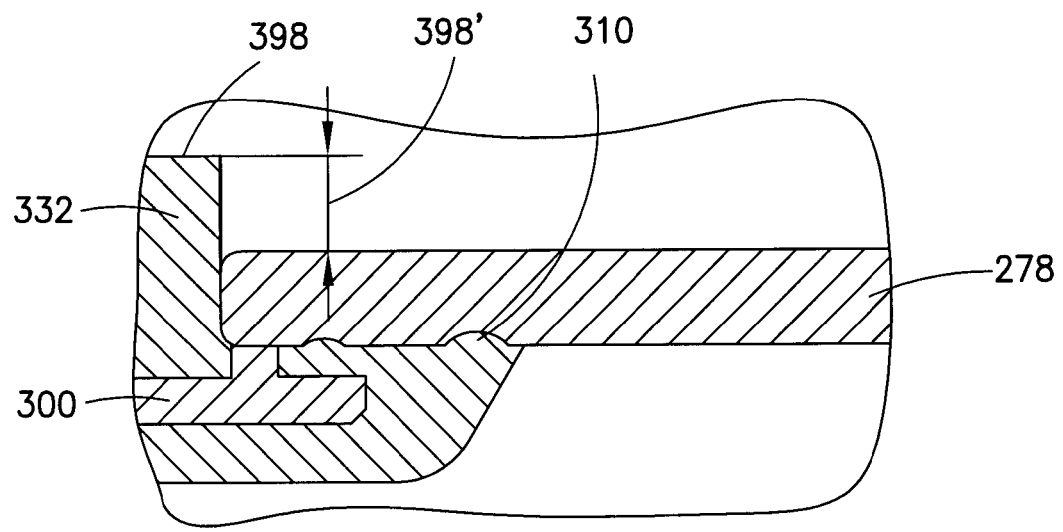
FIG. 11 shows a contact ring seal in a clamped position.
Figure 12:
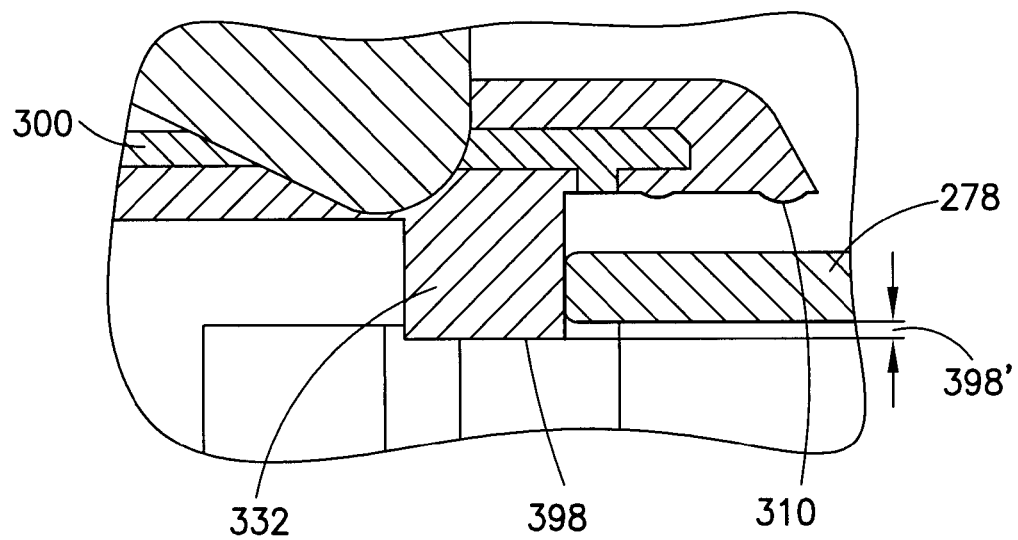
FIG. 12 shows a contact ring seal in an unclamped position.

FIGS. 11-12 help illustrate the relative positions of the substrate 278 relative to the CRS 300 on the loader when the substrate is clamped and when unclamped to the chuck 370. Referring now to FIG. 11, there is shown a section of contact ring seal 300 with substrate 278 in a clamped position. Referring also to FIG. 12, there is shown a section of contact ring seal 300 with substrate 278 in an unclamped position. In either embodiment, substrate 278 may be supported by chuck 370 in a noncontact fashion. In FIG. 11, in the clamped position, the vertical distance 398' from the top 398 of align boss 332 to the wafer 278 may be about 1.23 mm or otherwise. In FIG. 12 an in the unclamped position, the vertical distance 398' from the top 398 of align boss 332 to the wafer 278 may be about 0.25 mm or otherwise. Here, when substrate 278 is floated on air bearing chuck 370 in the unclamped position as seen in FIG. 12, boss 332 of contact ring seal 300 may still positively locate substrate 278 with respect to ring 300. In alternate embodiments, any suitable locating feature, gaps or distances may be provided.

Figure 22:
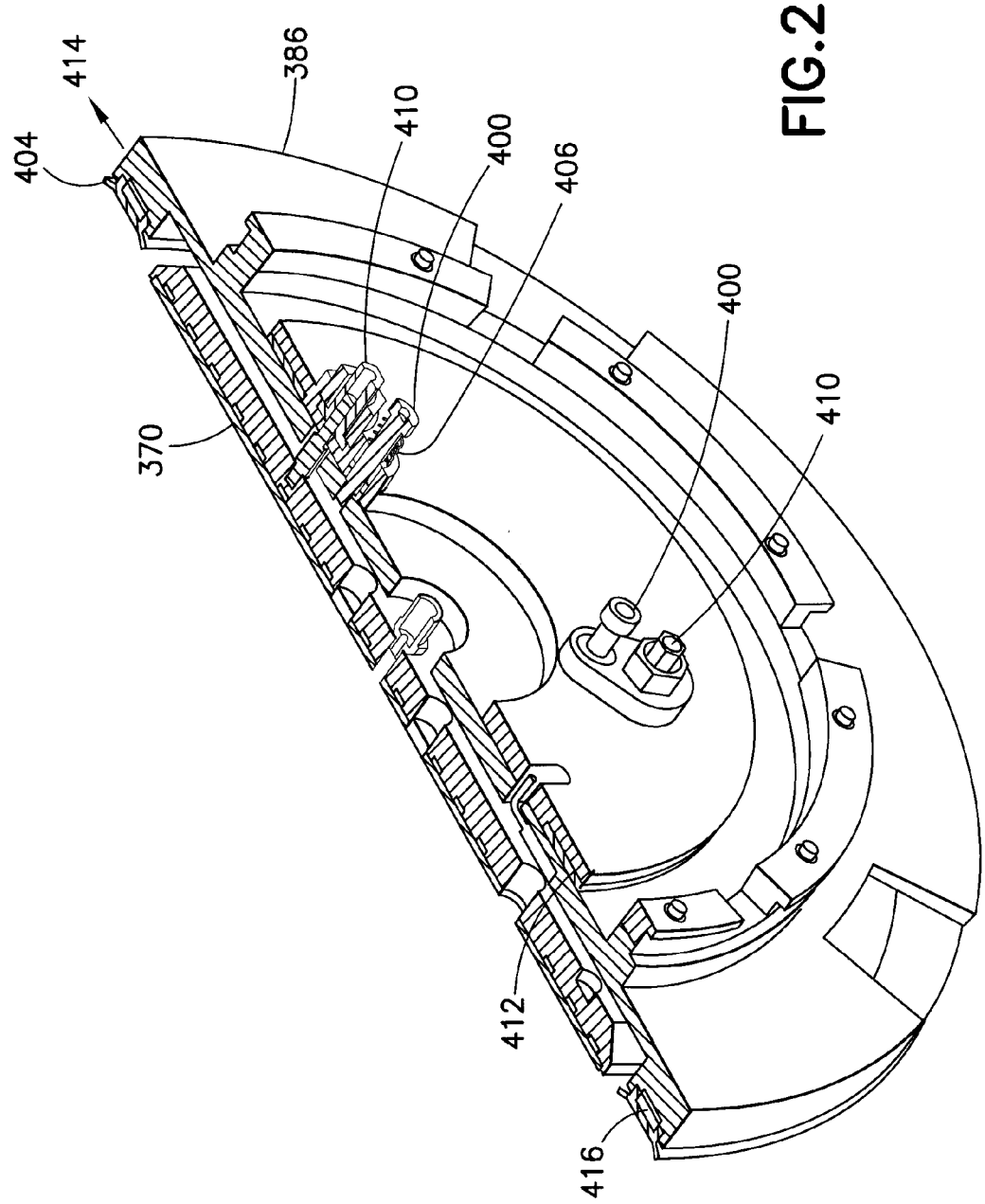
FIG. 22 shows a section view of an air bearing chuck assembly.

Referring now to FIG. 13, there is shown a portion of the door assembly with air bearing chuck 370 in a retracted position (down or inward in the frame of reference of FIG. 13). Referring also to FIG. 14, there is shown air bearing chuck 370 in an extended (up or outward) position. In the embodiment shown, chuck 370 is axially moveable with respect to contact ring seal vacuum ring 386. Shoulder screws 400 are shown fastened and grounded to ring 386 and are shown in combination with flanged bearings 402 to constrain the surface of chuck assembly 370 to remain substantially parallel with ring assembly 386 during axial extension and retraction of the chuck assembly, for example, during a destick operation where the face of chuck assembly 370 remains substantially parallel with the suction and locating feature 404 of ring assembly 386 during motion regardless of the orientation or location of the origin of a de-stick between a substrate and a contact ring seal held by feature 404 and regardless of the propagation of the destick. In alternate embodiments, any suitable mechanism, such as combinations of slides, bushings or any suitable guide or otherwise may be provided to constrain chuck assembly 370 substantially parallel with ring assembly 386 during motion. Referring also to FIG. 22, there is shown a cross section of a portion of door assembly 356 with air bearing chuck 370 where contact ring seal vacuum ring 386 (seated on the support surface of the door frame) is provided with a Viton® vacuum ring 404, contact ring seal vacuum ports 416, air bearing plate 370 and contact ring seal vacuum supply 414. Shoulder screws 400 may be provided with springs between their respective heads and backing plate 408 where backing plate 408 is coupled to chuck 370 with locking and jacking assemblies 410 that allow for fine adjustment, for example, leveling or otherwise of the surface location of chuck 370. Here, the springs 406 provide a preload and bias chuck 370 in the extended or up position as shown in FIG. 14 which corresponds to a position where bladder 412 is deflated. Alternately, where bladder 412 is inflated, chuck 370 is axially moved to the retracted location shown in FIG. 13. A similar guidance and constraint approach is provided for engagement of the contact ring seal assembly with the holder utilizing a secondary bladder as described below. In the embodiment shown, FIG. 14 shows chuck 370 extended or up whereas FIG. 13 shows chuck 370 retracted or down where the wafer may be initially placed by the pick up and flip device on the contact ring seal with chuck 370 retracted as seen in FIG. 13. In application, bladder 412 (under suitable control from controller 222) moves chuck 370 axially where filling bladder 412 retracts chuck 370 as seen in FIG. 13. This disengages the wafer to contact ring seal 300, wherein emptying bladder 412 in combination with spring return 406 provide a damped motion profile that engages chuck with wafer 278 and separates wafer 2 pressure at an outer edge 78 from seal 310 of contact ring seal 300. Nitrogen filtered gas may be further provided as the media for chuck 370. As such a first condition exists as in FIG. 13 where the chuck 370 is retracted with vacuum and gas flow, suction holds the wafer down against the contact ring seal 310 and a second condition exists as in FIG. 14 where the chuck 370 is extended with gas flow, there is gap between the wafer and the chuck with the wafer floating on an air bearing cushion with seal 310 and wafer 278 separated where a destick condition exits but also where wafer 278 is still engaged with the alignment bosses on contact ring seal 300 as seen in FIG. 12. The condition in FIG. 13 may further be referred to as vacuum mode where chuck 370 is retracted with nitrogen and vacuum on where wafer 278 is on the contact ring seal seals 310 and the suction has purposes including rotation of the wafer from horizontal to vertical or during translation or otherwise. The condition in FIG. 14 may further be referred to as air bearing mode where chuck 370 is extended with nitrogen on where a gap exists between chuck 370 and wafer 278 where wafer 278, for example, may drive to contact ring seal location bosses, for example by gravity for location against the bosses to keep the nitrogen flow down for particle concerns but any suitable combination of vacuum force, gravity or otherwise may be used.

Figure 31:
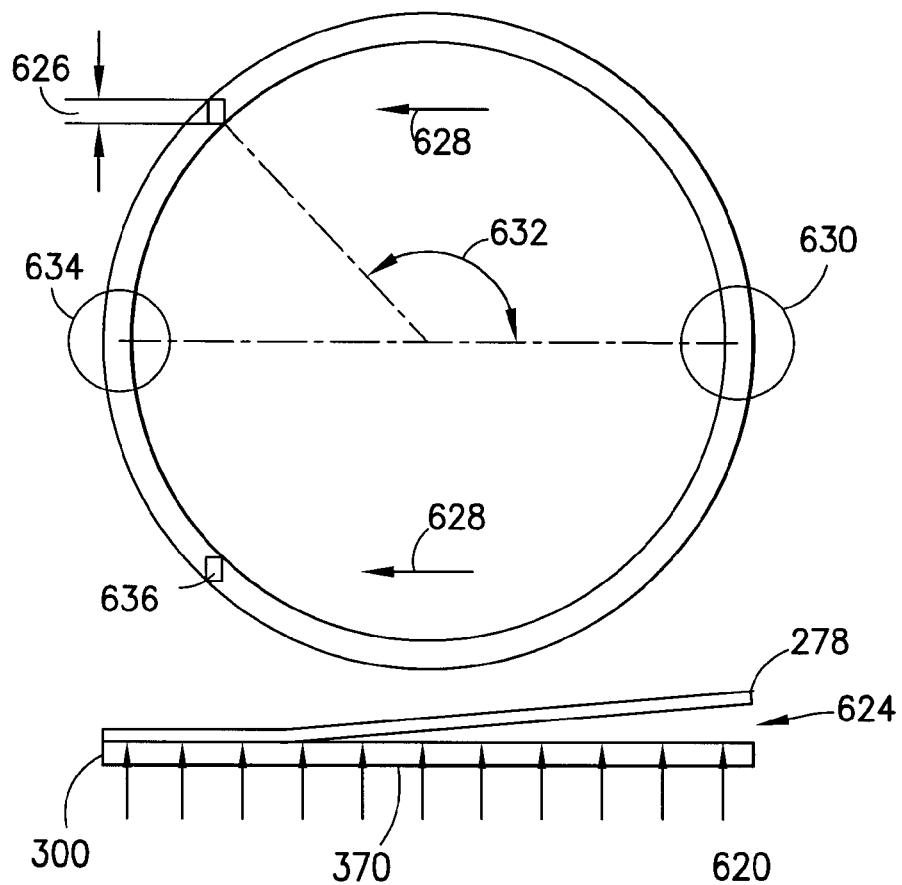
FIG. 31 shows a top view and a side view of a peel interface.

In the embodiment shown, substrate separation or transport chuck 370 is shown that may separate and transport substrate 278 from an adhering surface 300. Support 386 is shown gripping or supporting adhering surface 300. Alternately, substrate support 386 may have an integral seal 300 to support substrate 278. Here, seal 300 may be a peripheral edge seal to seal a peripheral edge of substrate 278. In alternate embodiments, any suitable seal or adhering surface in any suitable shape may be provided. Air bearing surface 370 is shown to support substrate 278 with air bearing surface 370 axially moveable relative to support 386, for example, moveable between the position shown in FIG. 13 to that shown in FIG. 14. Air bearing surface 370 may have a first position as seen in FIG. 13 adjacent substrate 278 with substrate 278 coupled to adhering surface 300. Air bearing surface 370 is shown moveable from the first position in FIG. 13 to a second position in FIG. 14 separating substrate 278 from adhering surface 300 without contact between substrate 278 and air bearing surface 370. In the embodiment shown, a mechanism is provided to separate substrate 278 from sealing surface 300 and having retaining support structure 386 that may grip sealing surface 300 and with a moveable central chuck 370 positioned within retaining support structure 386 with moveable central chuck 370 having a non-contact substrate clamping portion or surface. Controller 222 may be configured for providing one or more predetermined combinations of air bearing pressure and partial vacuum caused by gas flow of the non-contact substrate clamping portion to generate a non-contact force on substrate 278. Here, the non-contact force overcomes adhesive forces between sealing surface 300 and substrate 278 where the non-contact force transports and positions substrate 278 with moveable central chuck 370, for example, between the position shown in FIG. 13 and that of FIG. 14. In the embodiment shown, air bearing chuck surface 370 and peripheral edge seal 300 are shown relatively moveable from a first position as seen in FIG. 13 with substrate 278 contacting peripheral edge seal 300 to a second position as seen in FIG. 14 with substrate 278 not contacting peripheral edge seal 300. Here, substrate 278 is adhered to peripheral edge seal 300 when contacting peripheral edge seal 300 where air bearing chuck surface 370 effects separation of substrate 278 from peripheral edge seal 300 when transitioning from the first position as seen in FIG. 13 to the second position as seen in FIG. 14. Here air bearing chuck surface 370 may effect the separation of substrate 278 from peripheral edge seal 300 without air bearing chuck surface 370 contacting substrate 278. Here, air bearing chuck surface 370 and substrate support 386 are movably coupled having a first position as seen in FIG. 13 with substrate 278 contacting substrate support 386 and a second position as seen in FIG. 14 with substrate 278 not contacting substrate support 386. Here, substrate 278 is attracted to substrate support 386 and air bearing chuck surface 370 by air bearing chuck surface 370 when substrate is contacting substrate support 386 and with air bearing chuck surface 370 in the first position as seen in FIG. 13 where support 386 may have seal 300 and where substrate 278 may be adhered to seal 300. Substrate 278 may be repelled from substrate support 386 and separated from substrate support 386 and hence seal 300 by air bearing chuck surface 370 when air bearing chuck surface 370 transitions from the first position as seen in FIG. 13 to the second position as seen in FIG. 14. Here, air bearing chuck surface 370 transitions from the first position to the second position without air bearing chuck surface 370 contacting substrate 278. Air bearing surface 370 may have an air bearing region and a vacuum region where air bearing surface 370 may be a substantially porous media. Here, porosity of the porous media may be uniform or alternately non uniform, for example, porosity at an outer edge of air bearing surface 370 may be larger than porosity at a center of air bearing surface 370. Pressure across air bearing surface 370 may be uniform or alternately non-uniform, for example, pressure supplied to an outer edge of air bearing surface 370 may be larger than pressure supplied to a center of air bearing surface 370. Air bearing surface 370 may be constrained to remain substantially parallel to adhering surface 300. In one embodiment, air bearing surface 370 may have an air bearing hole pattern that is axisymmetric. Air bearing surface 370 may have uniform lift across air bearing surface 370 or alternately non uniform lift, for example, an air bearing pattern that increases lift at an outer edge of the air bearing surface as compared to a center of the air bearing surface. In the embodiment shown, air bearing surface 370 is axially moveable relative to the support with a predetermined motion profile. Here, substrate 278 may be attracted and may be adhered to adhering surface 300 and air bearing surface 370 by suction of a vacuum region of air bearing chuck surface 370 when in the first position as seen in FIG. 13 and not contacting substrate 278 where substrate 278 floats on a cushion of gas of a pressure region on air bearing surface 370 when in the second position as seen in FIG. 14 without contacting substrate 278. Air bearing surface 370 may be constrained to remain substantially parallel to adhering surface 300 regardless of a de-stick propagation location as seen in FIG. 31 between substrate 278 and adhering surface 300 while substrate 278 is separating from the adhering surface 300. Air bearing surface 370 may be moved from the first position to the second position by a force applied by a preloaded spring 406 and damped between air bearing surface 370 and adhering surface 300. In one embodiment, the air bearing surface may have an outer annular region having a higher gas flow or pressure as compared to an inner annular region of air bearing surface 370 where the outer annular region provides a stiffer interface between the substrate and the air bearing surface as compared to the inner annular region. In alternate embodiments, more or less features may be provided.

One or more de-stick operations may be done after process operations during unload of processed wafers where a second de stick operation may be used to remove wafer 278 from wafer holder 270. Here, de-stick #1 may be removing wafer 278 from wafer holder 270 (see e.g. FIG. 3, O-ring 317 on holder seal 270) and de-stick #2 may be removing wafer 278 from the sealing ring 300. Stiction may come from different sources. For example, some wafer holders may have o-rings, gaskets or seals 317 within them in addition to the contact ring seal 310 which may adhere to the wafer and prevent proper handling. Potential sources of wafer holder or contact ring seal sticking sources and causes which may require de-sticking may by way of example include: heat and pressure over time; sealing o-rings or seals that wafer 278 seals against; suction effects such as local vacuum due to mechanical flexure or otherwise; polymeric materials; flat surfaces interaction and related vacuum effects; residual chemistry; electrostatic forces; Van der Waals forces; variations in coatings or materials; time variations of materials due to chemistry or otherwise; time variations of sticking force (set, contact area . . . ); tack and stiction in general or otherwise. As such, a de-sticking operation and the related forces and interactions while able to be bounded may not be necessarily predictable. Therefore, chuck 370 is provided with a controllable non contact force in combination of a force and motion profile that may be stored in controlled memory and effected by suitable controller programming that provides destick without contact over a range of desired conditions. In the embodiment shown, the force on substrate 278 during de-stick may increase as a negative power of the gap thickness until it is at a small gap at which point the force applied is equal to the substrate surface area×pressure×an efficiency factor, where a typical efficiency factor is a value less than or equal to 0.5. Further, air bearing force (lift) applied by chuck 370 also increases at small gap. Conversely, vacuum force (suction) which in theory is equal to the number of holes×hole area×vacuum level at zero gap but where at finite gap the force=vacuum level×the number of holes×an effective hole area. Further, gravity offsets or adds to the vacuum force depending upon attitude of substrate 278. Hence, the net force applied to the wafer includes gravity, vacuum force, air bearing force+external forces (seal, pressure differential or otherwise) where a net effect may be as the chuck gets closer to the wafer 278, air bearing force may get larger than other effects preventing contact between substrate 278 and surface 370. As will be shown below, for example in FIG. 31, stiction to be overcome may not necessarily be distributed uniformly around the edge of the wafer and may be axisymmetric or otherwise. As such, chuck 370 may have a diameter close to that of the wafer for mechanical advantage and moment arm. In the exemplary embodiment, the diameter of the chuck as well as the hole pattern may be configured as desired, particularly at the edge, to provide the chuck diameter as large as possible and, consistent with desired suction force and while allowing the air bearing gas flow to exit between the edge of the wafer and the ring portion of the contact ring seal. In the embodiment shown, the chuck geometry and springs in combination with flow out of bladder 412 generates a motion profile of the chuck 370 in combination with a force profile on the wafer. Here, to lift chuck 370 as in FIG. 14, springs 406 lift chuck 370 and offset bladder force and venting where restriction (tubing, valve, otherwise) Cv value sets the rate at which bladder 412 deflates. Here, motion rate may be set by flow restriction or otherwise. Here, the geometry of chuck 370 and the mechanism by which the chuck plate is moved results in a force and time profile applied to the wafer which allows de stick without contact or losing the wafer, for example, where the wafer may move past the align bosses but does not based on the chuck 370 retention characteristics.

Figure 15:
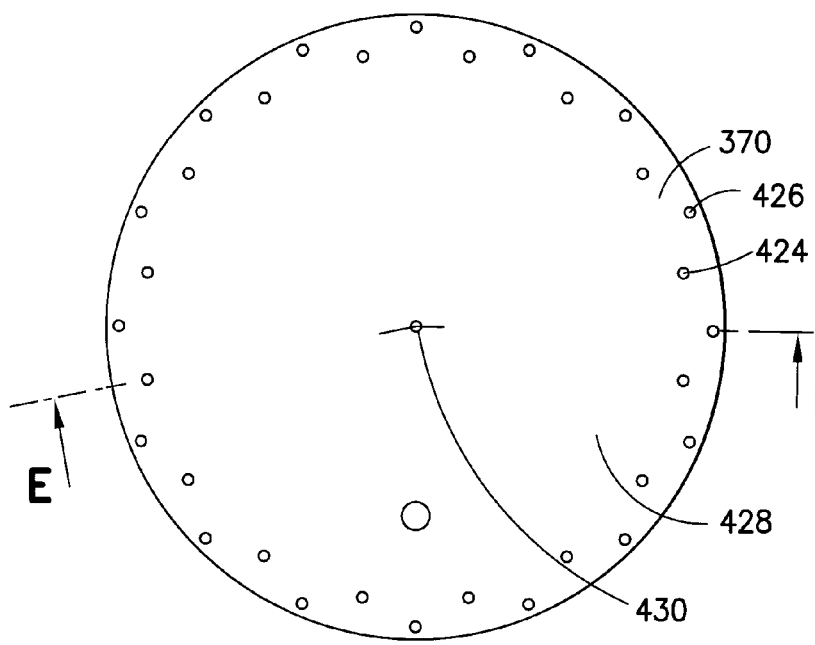
FIG. 15 shows a top view of an air bearing chuck.
Figure 16:
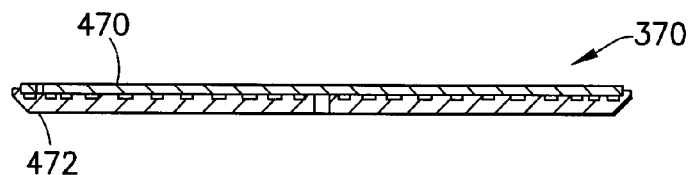
FIG. 16 shows a section view of an air bearing chuck.
Figure 17:
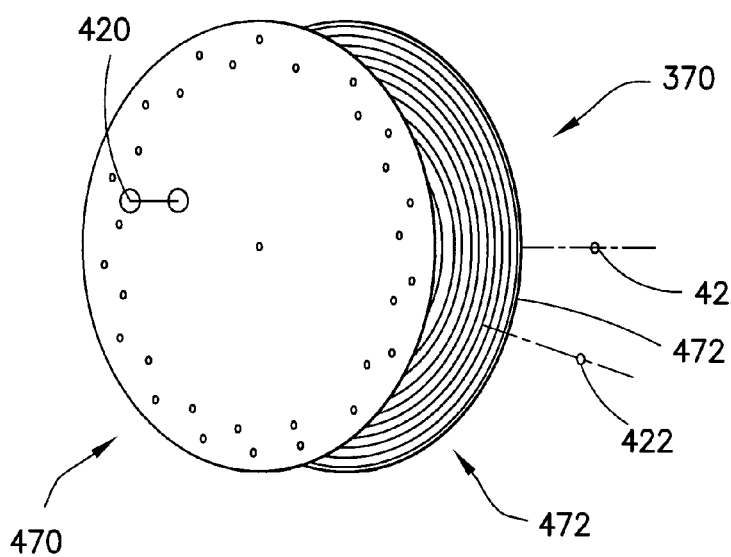
FIG. 17 shows an exploded view of an air bearing chuck.

Referring now to FIG. 15, there is shown a top view of air bearing chuck 370. Referring also to FIG. 16, there is shown a section view of air bearing chuck 370. Referring also to FIG. 17, there is shown an exploded view of air bearing chuck 370. In the embodiment shown, air bearing chuck 370 has bearing surface 470, manifold or base 472, transparent wafer presence sensor plug 420 and set screws or plugs 422. In the embodiment shown, the back of air bearing chuck plate 470 may have uniform pressure nitrogen or otherwise in manifold 472 with alternating regions of vacuum in either a separate isolated manifold or in separate regions of manifold 472 as will be described where manifold 472 may be provided with different pressure regions and/or vacuum regions. One or more circular vacuum channels may also be provided on an outer edge of chuck 370 or otherwise. In the embodiment shown, first annular hole pattern or region 424 may be provided with a selective first pressure to be applied. Second annular hole pattern or region 426 may be provided with a selective vacuum level to be applied. Third annular region 426 may be provided with a selective second pressure to be applied where the second pressure may be the same or different than the first pressure. Third annular hole pattern or region 430 may be provided with a selective vacuum level to be applied. As will be described with respect to the disclosed embodiments, different regions of chuck 370 may be provided with different pressure and vacuum levels to provide the desired stiffness and float characteristics at different portions of chuck 370. By way of example, the outer air bearing region 424 may be provided with a higher pressure, or greater porosity than the inner air bearing region 428 where additional stiffness or lift may be provided at the outer edge of a substrate to compensate, for example, for de-sticking forces. In alternate embodiments, any suitable combination of vacuum and/or pressure regions may be provided. For example, vacuum regions in chuck 370 may or may not be uniformly distributed. By way of example: holes may be uniformly distributed; holes may be non uniformly distributed where more or less may be provided in any region of the chuck; portions of the air bearing material may be used as vacuum region(s) in any suitable pattern; an annular ring or rings of vacuum region may be applied to the chuck; or alternating radial or axial patterns may be provided. Alternately, any suitable pattern may be provided. By way of further example, air bearing regions in chuck 370 may or may not be uniformly distributed. By way of example: the air bearing surface may be uniformly distributed; the air bearing surface may be non uniformly distributed, for example in a substantially axisymmetric pattern alone or in combination; porosity across the air bearing surface may be non uniformly distributed where more or less may be provided in any region of the chuck, for example, higher porosity may be provided at an edge region of the chuck; pressure across the air bearing surface may be non uniformly distributed where more or less may be provided in any region of the chuck, for example, higher pressure may be provided at an edge region of the chuck; portions of the air bearing material may be used as vacuum region(s) in any suitable pattern; an annular ring or rings of air bearing regions may be applied to the chuck, for example, regions of differing porosity or differing pressure in the case of a separated manifold; or alternating radial or axial patterns may be provided. Alternately, any suitable air bearing pattern may be provided alone or in combination with any suitable vacuum pattern. Through the selective application of pressure(s), via nitrogen or otherwise, in the air bearing region either alone or in combination with vacuum, substrate 278 may be supported and held by chuck 370. For example, with a nitrogen pressure applied, for example, between 10 and 60 psi. or otherwise, a gap of between about 65 um and about 150 um at an edge and a gap of between about 100 um and about 250 um at a center of substrate 278 may be obtained with vacuum off. As a further example, with a nitrogen pressure applied, for example, between 10 and 60 psi. or otherwise, a gap of between about 25 um and about 150 um at an edge and a gap of between about 75 um and about 150 um at a center of substrate 278 may be obtained with vacuum on. In alternate embodiments, for example, with different porosities, patterns or otherwise, any suitable pressure, vacuum or gap distribution may be provided.

Figure 18:
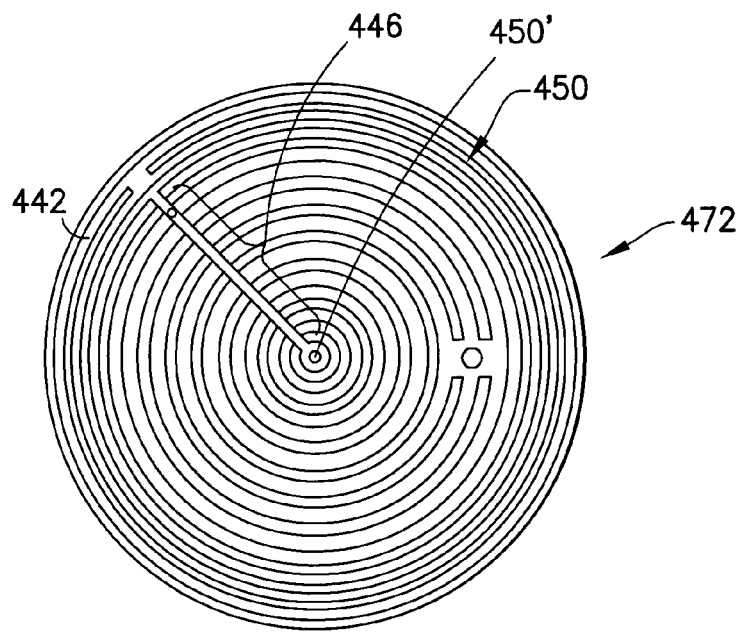
FIG. 18 shows a top view of a manifold.
Figure 19:
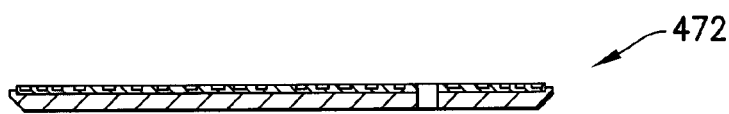
FIG. 19 shows a section view of a manifold.
Figure 20:
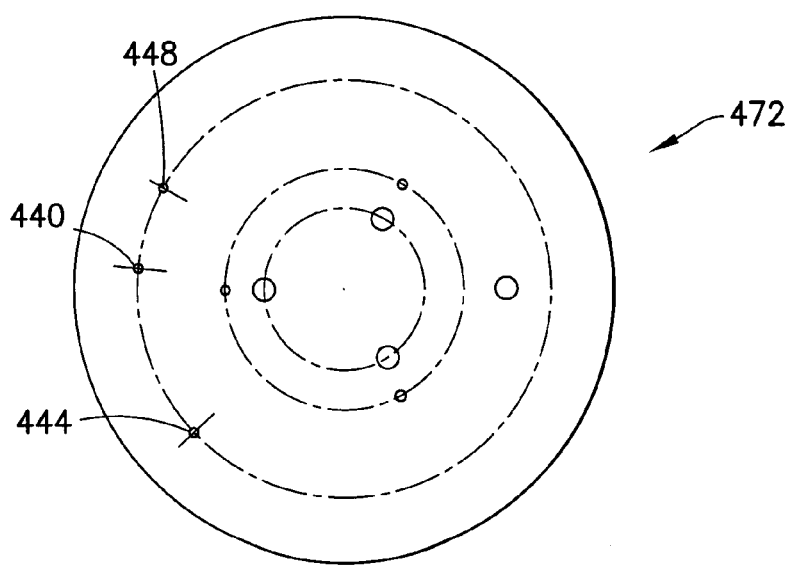
FIG. 20 shows a lower view of a manifold.
Figure 21:
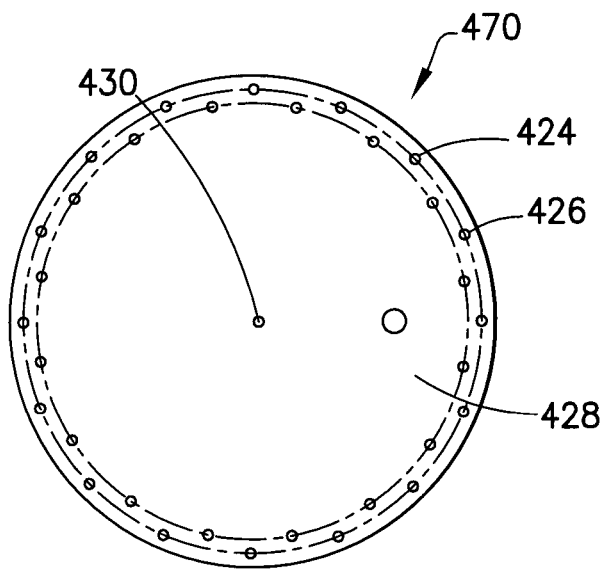
FIG. 21 shows a top view of an air bearing plate.

Referring now to FIG. 18, there is shown a top view of manifold 472. Referring also to FIG. 19, there is shown a section view of manifold 472. Referring also to FIG. 20, there is shown a lower view of manifold 472. Manifold 472 has first pressure port 440 corresponding to first annular pressure region 442, second pressure port 444 corresponding to second pressure region 446 and vacuum port 448 corresponding to vacuum region 450 and 450'. Here, the respective ports are in communication with their respective regions allowing (via controller 222 or otherwise) selective application of pressure and/or vacuum in the selective region(s). Referring also to FIG. 21, there is shown a top view of air bearing plate 470. In the embodiment shown, air bearing plate 470 may be bonded to manifold 470 and has first annular region 424 corresponding to pressure region 442, second annular region 424 corresponding to vacuum region 450, third annular region 428 corresponding to pressure region 446 and fourth annular region 430 corresponding to vacuum region 450'. In alternate embodiments, any suitable combination of vacuum and pressure region(s) may be provided.

Figure 23:
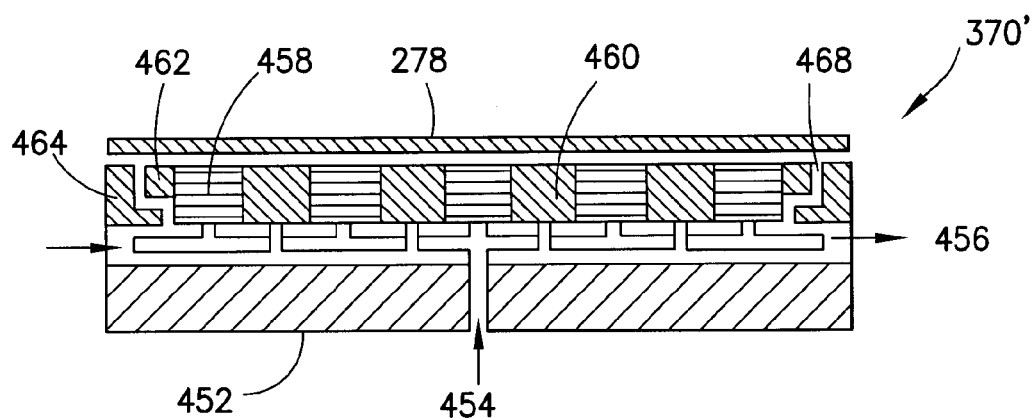
FIG. 23 shows a section view of an air bearing chuck assembly.

Referring now to FIG. 23, there is shown a section view of a further exemplary embodiment air bearing chuck assembly 370' supporting substrate 278. In the embodiment shown, air bearing chuck assembly 370' has manifold 456 may be pressurized 454 over surface regions 458 and may have vacuum applied 456 over surface regions 460. Here, surface regions 458, 460 may be made of a unitary air bearing material, different materials or otherwise and may provide alternating regions of vacuum and pressure or otherwise. Rings 462, 464 are shown at an edge of air bearing chuck assembly 370' forming a circular vacuum channel 468 in fluid communication with vacuum 456. Rings 462, 464 may be integrally or separately formed with surface regions 458, 460 of the same or different materials in any suitable combination. Circular vacuum channel 468 may be provided, for example, to draw particles or other contamination. In alternate embodiments, any suitable pattern may be provided.

Figure 24:
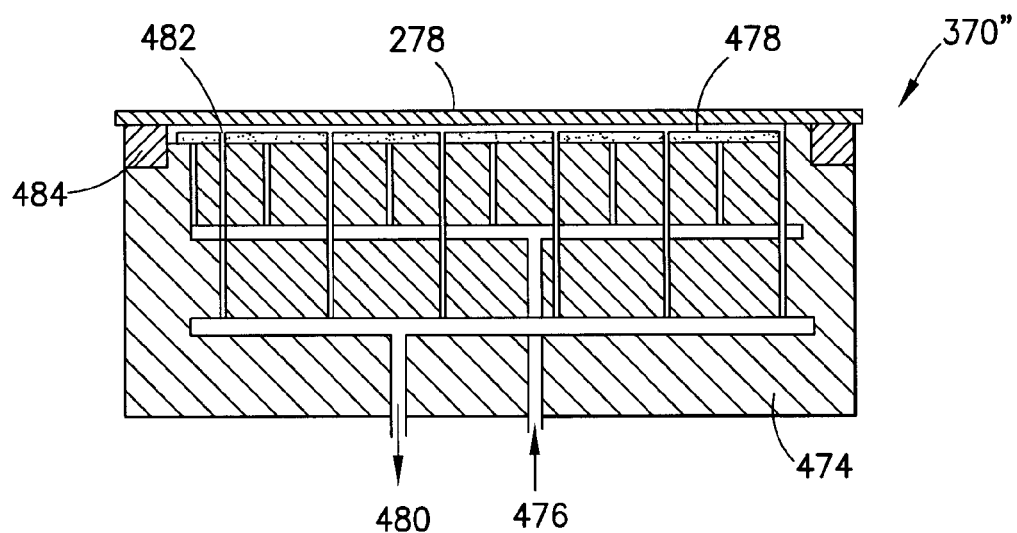
FIG. 24 shows a section view of an air bearing chuck assembly.

Referring now to FIG. 24, there is shown a section view of yet another exemplary embodiment air bearing chuck assembly 370" supporting substrate 278. In the embodiment shown, air bearing chuck assembly 370" has manifold 474 and may be pressurized 476 over surface region(s) 478 and may have vacuum applied 480 over surface region or hole pattern 482. Here, surface regions 478, 482 may be made of a unitary air bearing material, different materials or otherwise and may provide alternating regions of vacuum and pressure or otherwise. Ring 484 is shown at an edge of air bearing chuck assembly 370". Here, ring 484 may be integrally or separately formed with surface regions 478, 482 of the same or different materials in any suitable combination. A circular vacuum channel may alternately be provided, for example, to draw particles or other contamination. In alternate embodiments, any suitable pattern may be provided.

Figure 25:
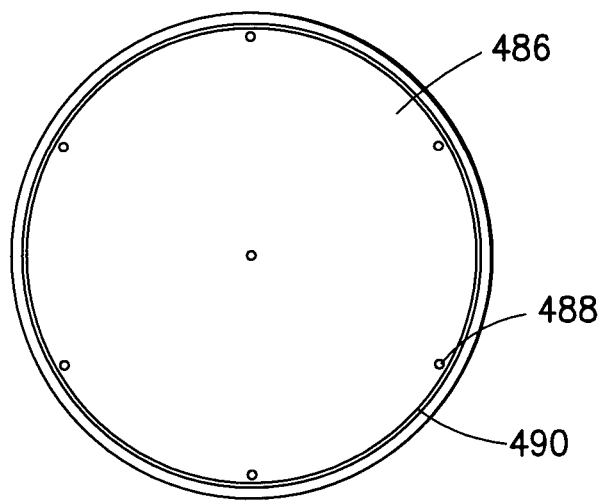
FIG. 25 shows a top view of an air bearing plate.

Referring now to FIG. 25, there is shown a top view of still another exemplary embodiment air bearing plate 370'''. In the embodiment shown, air bearing chuck assembly 370''' has air bearing surface region 458 and may have vacuum applied over 7 vacuum holes 488 in combination with circular vacuum channel 490. In alternate embodiments, any suitable pattern may be provided.

Figure 26:
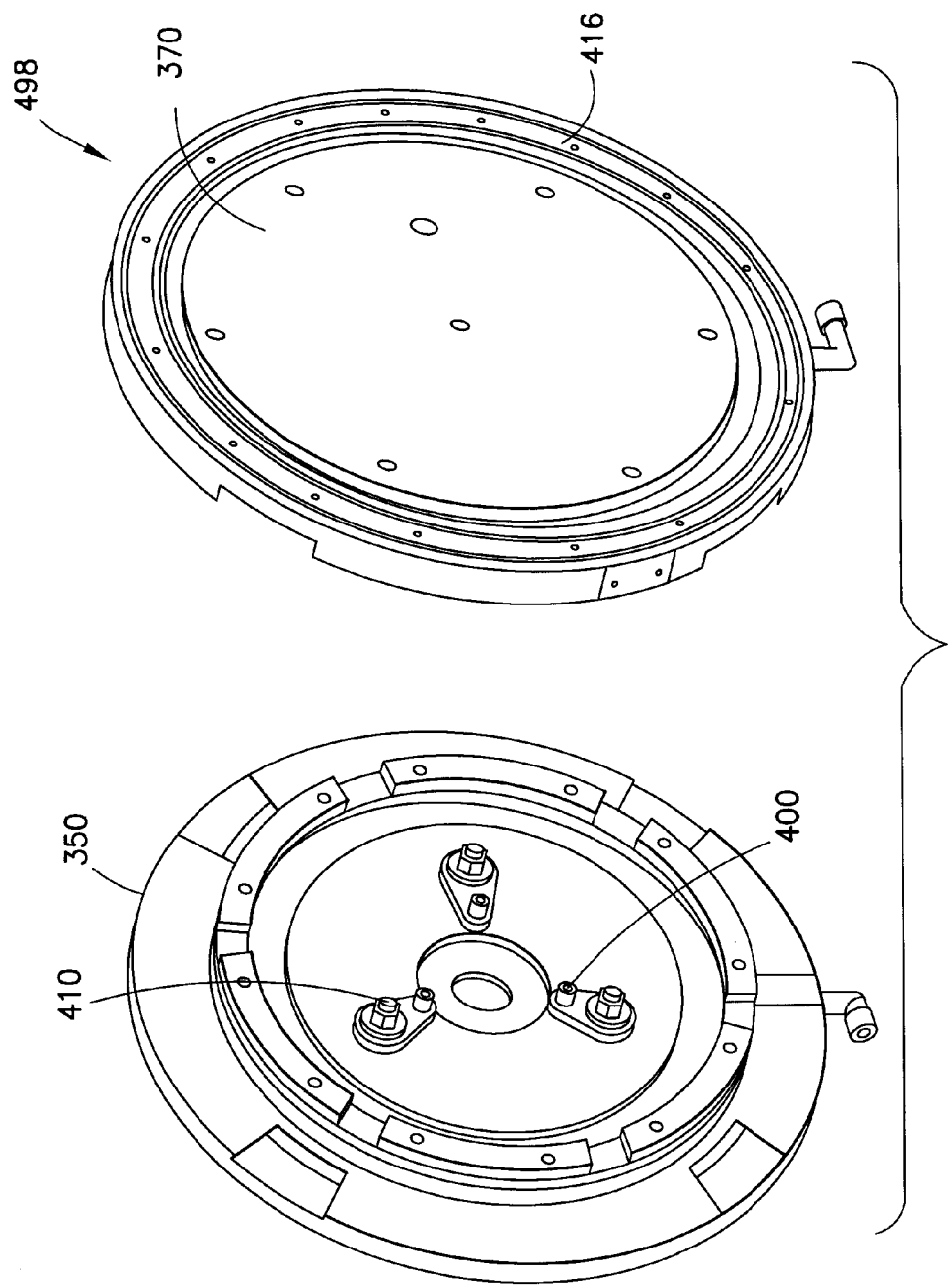
FIG. 26 shows an isometric view of an air bearing chuck assembly.
Figure 27:
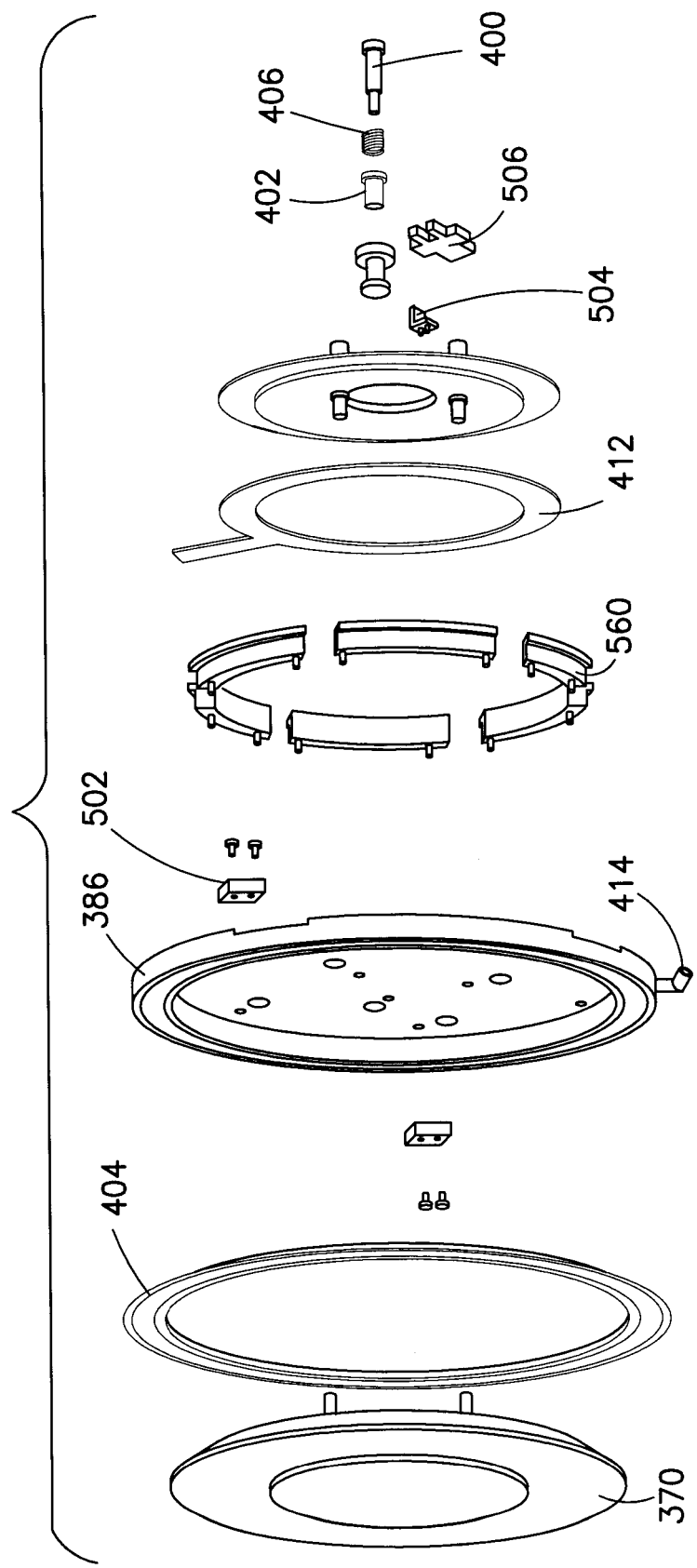
FIG. 27 shows an exploded isometric view of an air bearing chuck assembly.

Referring now to FIG. 26, there is shown an isometric view of a representative air bearing chuck and ring assembly 498 with chuck assembly 370 and contact ring seal vacuum ring 386. Referring also to FIG. 27, there is shown an exploded isometric view of an air bearing chuck and ring assembly 498. In the embodiment shown, chuck 370 is axially moveable with respect to contact ring seal vacuum ring 386 in a manner similar to that described previously. Shoulder screws 400 are shown fastened and grounded to ring 386 and are shown in combination with flanged bearings 402 to constrain the surface of chuck assembly 370 to remain substantially parallel with ring assembly 386 during axial extension and retraction of the chuck assembly where the face of chuck assembly 370 remains substantially parallel with the suction and locating feature 404 of ring assembly 386 during motion regardless of the orientation or location of the origin of a destick between a substrate and a contact ring seal held by feature 404 and regardless of the propagation of the destick. In alternate embodiments, any suitable mechanism, such as combinations of slides bushings or any suitable guide or otherwise may be provided to constrain chuck assembly 370 substantially parallel with ring assembly 386 during motion. Here, contact ring seal vacuum ring 386 is provided with a Viton® vacuum ring 404 with contact ring seal vacuum ports 416, air bearing plate 370 and contact ring seal vacuum supply 414. Shoulder screws 400 may be provided with springs between their respective heads and backing plate 408 where backing plate 408 is coupled to chuck 370 with locking and jacking assemblies 410 that allow for fine adjustment, for example, leveling or otherwise of the surface location of chuck 370. Here, the springs 406 provide a preload and bias chuck 370 in the position shown in FIG. 14 which corresponds to a position where bladder 412 is deflated. Alternately, where bladder 412 is inflated, chuck 370 is axially moved to the location shown in FIG. 13. Bearing capture 500 may be provided to capture the inner race of a bearing as will be described with respect to FIG. 29 to allow the chuck assembly to rotate, for example, where the contact ring seal lock pins engage and disengage the keyholes of the holder and where lock stop 502 is provided to prevent over travel. Flag 504 and photoelectric or other suitable sensor 506 may be provided to detect a position state of chuck 370 with respect to ring assembly 386.

Figure 28:
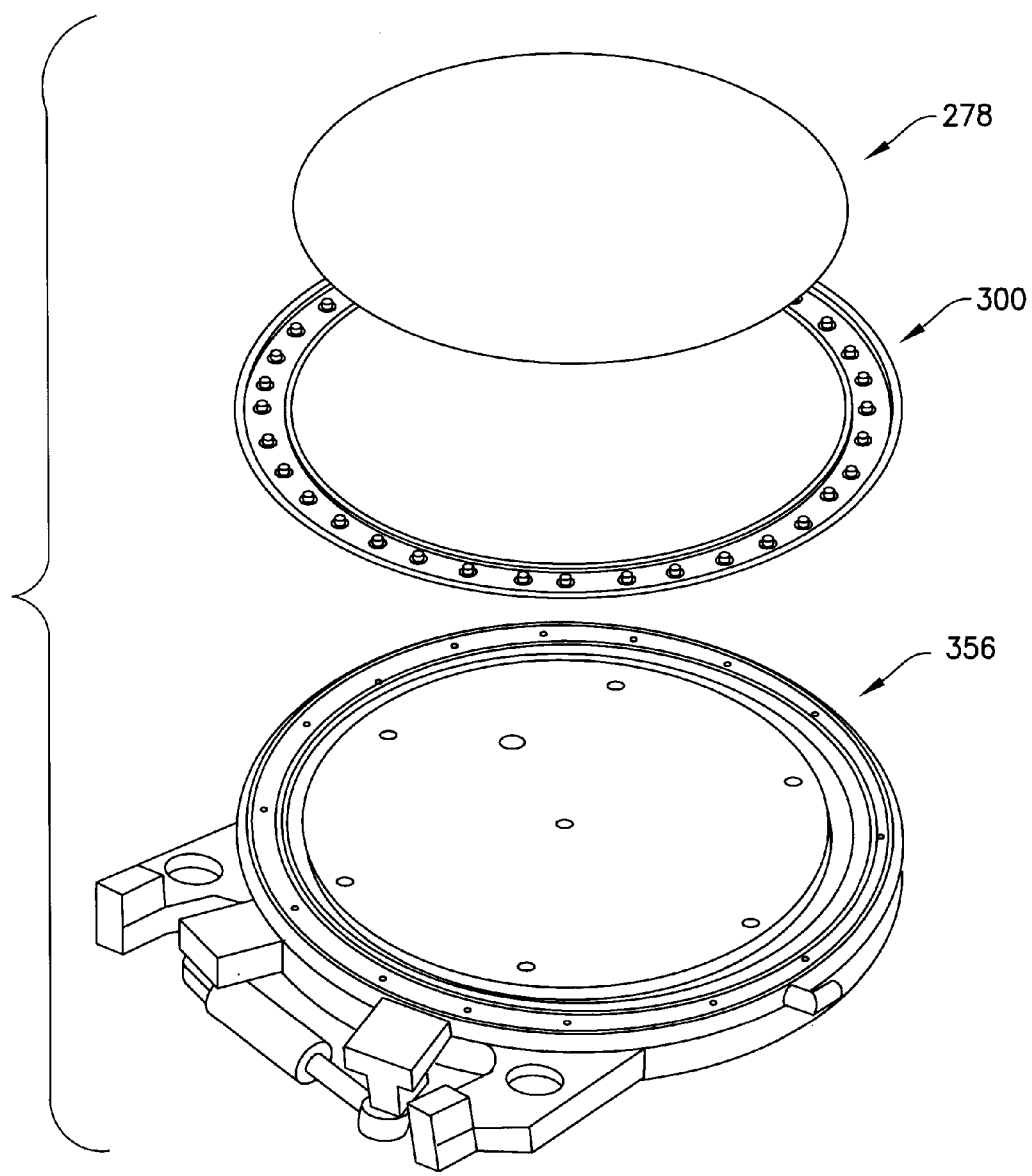
FIG. 28 shows an isometric view of an air bearing chuck door assembly.
Figure 29:
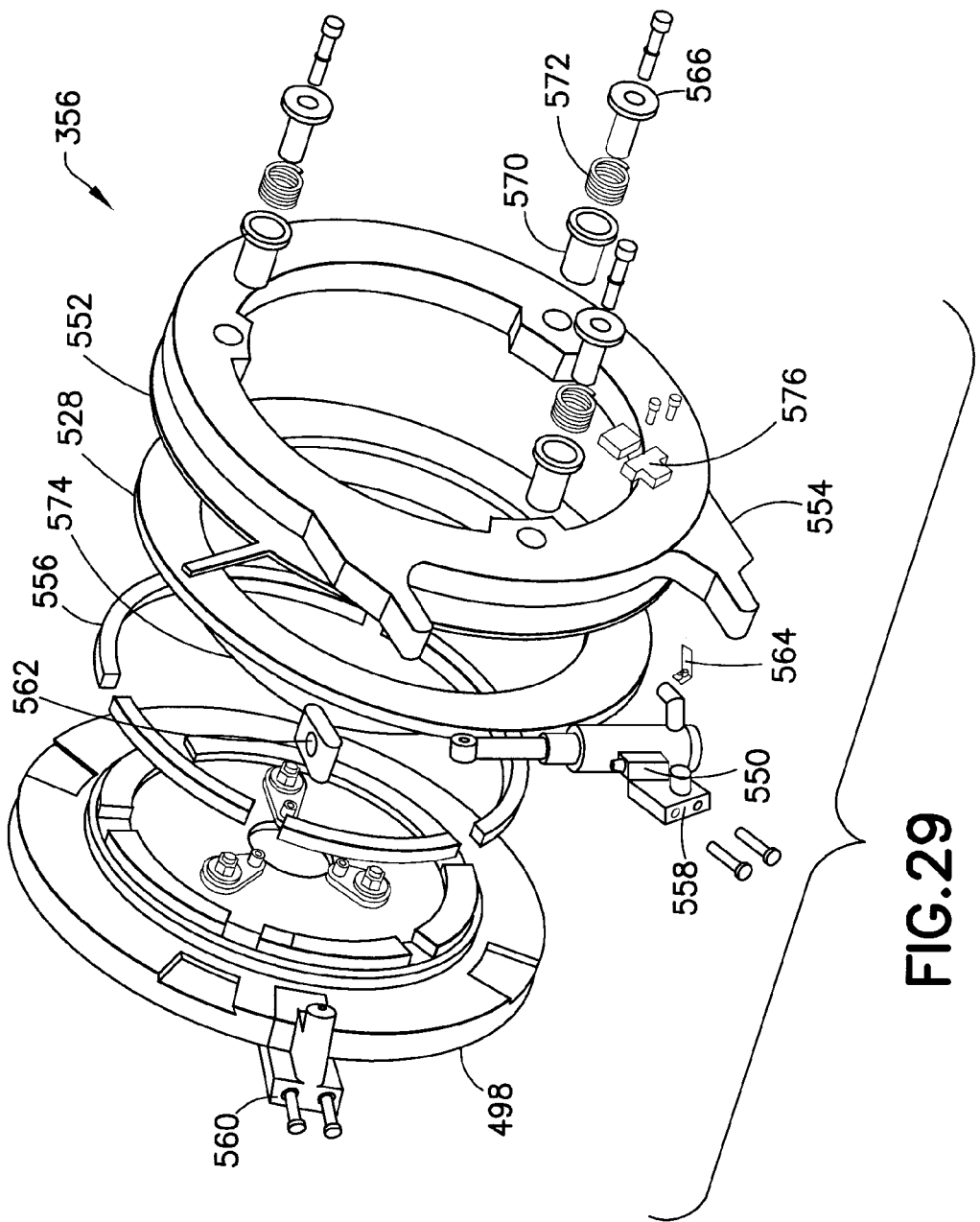
FIG. 29 shows an exploded isometric view of an air bearing chuck door assembly.

Referring now to FIG. 28, there is shown an isometric view of a representative air bearing chuck door assembly 356, contact ring seal 300 and substrate 278. Referring also to FIG. 29, there is shown an exploded isometric view of the air bearing chuck door assembly 356. In the embodiment shown, main door plate 554 may be grounded or coupled to swing axis 354 and engages, for example, clamps 358, 360 when loader 274 is performing a load or unload operation with respect to holder 270 (FIG. 7). The door assembly configuration illustrates for example purposes only, and in alternate embodiments the assembly and components may have any other desirable configuration. Translation plate 568 is coupled to main door plate 554 where door translation guides 566 are coupled to translation plate 568 and is axially moveable within flange bearings 570. Springs 572 bias translation plate 568 toward main door plate 554 as springs 572 are compressed between the shoulder on door translation guides 566 and the flange of flange bearings 570. Secondary bladder 552 is disposed between translation plate 568 and main door plate 554 where inflation separates translation plate 568 and main door plate 554 and where deflation biases translation plate 568 toward main door plate 554. Door translation flag 564 and photo electric sensor 576 are provided to detect the position state of translation plate 568 with respect to main door plate 554. Door translation guides 566 in combination with flange bearings 570 constrain the surface of translation plate 568 (and hence chuck assembly 370) to remain substantially parallel with the surface of main door plate 554 during axial extension and retraction of the translation plate 568 regardless of the orientation or location of the origin of a destick, for example from a substrate or contact ring seal or otherwise and regardless of the propagation of the destick. Chuck and ring assembly 498 is rotationally coupled to translation plate 568 by Bearing 574, for example, a 4 point Reali-Slim® 10.75" od×10" id bearing or otherwise where bearing capture plates 556 couple the outer race to translation plate 568 and where the inner race is coupled to Chuck and ring assembly 498 as previously described. Cylinder assembly 550 or any suitable actuator linear stepper or otherwise may have stops and or limit sensors and is coupled to Chuck and ring assembly 498 with moving cylinder mount 560 and is further coupled to main door plate 554 with fixed cylinder mount 558. Door lock block 562 may be provided, for example, to act as a stop or otherwise. In operation, the swing and tilt axes of loader 274 move the door assembly 356 where the door assembly includes bearing 574 for contact ring seal lock and unlock that is tightly integrated within the envelope of the door assembly 356 where secondary translation bladder 552 and guide assembly is provided for the final linear translation engagement of the contact ring seal studs into the spring plate. Here, guidance and constraint of the CRS axial engagement motion and chuck engagement motion minimize or eliminate play and maintain parallelism between the contact ring seal 300 and chuck 370 and the reference surfaces of the holder/wafer during actuation with their respective bladders.

Figure 30:
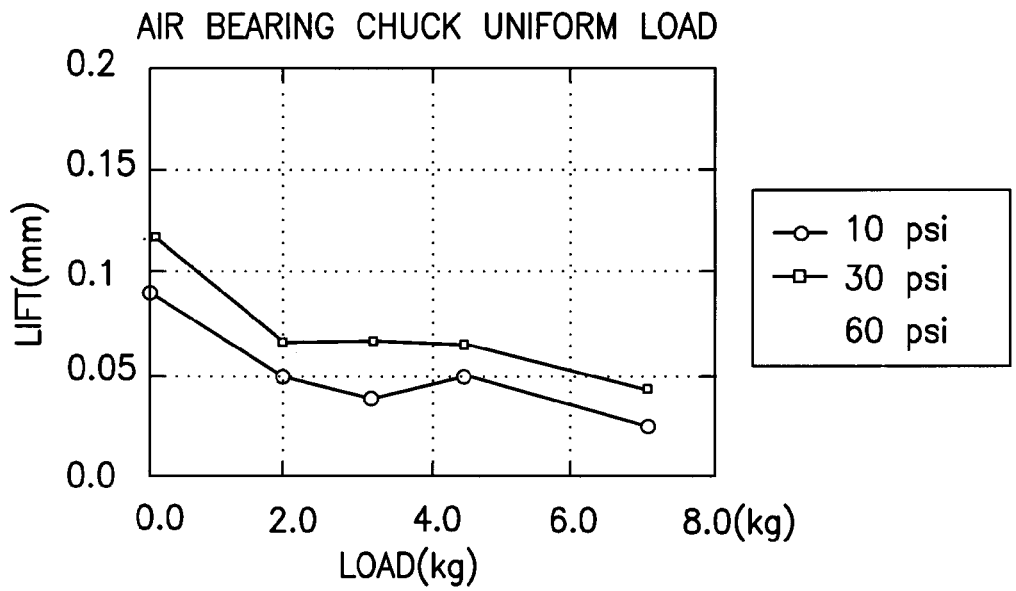
FIG. 30 is a graph showing several exemplary lift vs. force plots for different gas pressure of an air bearing chuck in accordance with an exemplary embodiment.

Referring now to FIG. 30, there is shown a graph 600 of lift vs. force for an air bearing chuck. As can be seen, if load increases then lift decreases. Further, if pressure increases then gap increases at both higher loads and at lower loads.

Referring now to FIG. 31, there is shows a top view of a peel interface and a side view of a peel interface. The graphical representation of a peel interface has contact ring seal and wafer 278 with the application of air bearing force 620. Peel angle 624 and peel interface width 626 are established with peel propagation 628 originating at a minimum sticking region 630 and propagating through peel positional angle 632 to a final sticking region 634 via a propagating peel interface location 636. In the embodiment shown, a model for separation of wafer from a contact ring seal may have three phases: 1. Initial separation at a minimum sticking position 630. 2. Peel mode propagation via a propagating peel interface location 636, and 3. Final sticking at position 634 of maximum required force. Peel strength is the average load per unit width of bond line required to separate progressively a flexible member from a rigid member or another flexible member. In the present embodiment, both the contact ring seal Viton® and the wafer are flexible due to their elasticity. Here, in the first phase, separation begins at a location of minimum sticking force 630. In the second "peel propagation" phase, the wafer peels from the contact ring seal. As the peel positional angle $\phi$ 632 increases, the peel interface width 626 increases as tan $\phi$. In a simple model of constant adhesive force, the air bearing force required to separate the bond-line also increases as tan $\phi$. The separation of wafer and contact ring seal will continue in a peel mode until it reaches an area of maximum sticking 634. If the adhesion is uniform then maximum sticking is opposite the initial location as shown. Alternately, the area of maximum sticking may be in another position if the adhesion is non-uniform, for example, the non-uniform adhesion may be caused by non-uniform coating wear or a localized chemistry buildup or otherwise. For pressure sensitive adhesives, typical peel forces may be a few lbs. per inch. In the embodiment shown, the contact ring seal effective seal width may only be a few mils for most $\phi$ 632, but may increase, for example, to an inch or so near $\phi=\pi$. As such, chuck 370 provides, for example, several lbs. of force without touching the wafer in order to de-stick without contact.

Figure 32:
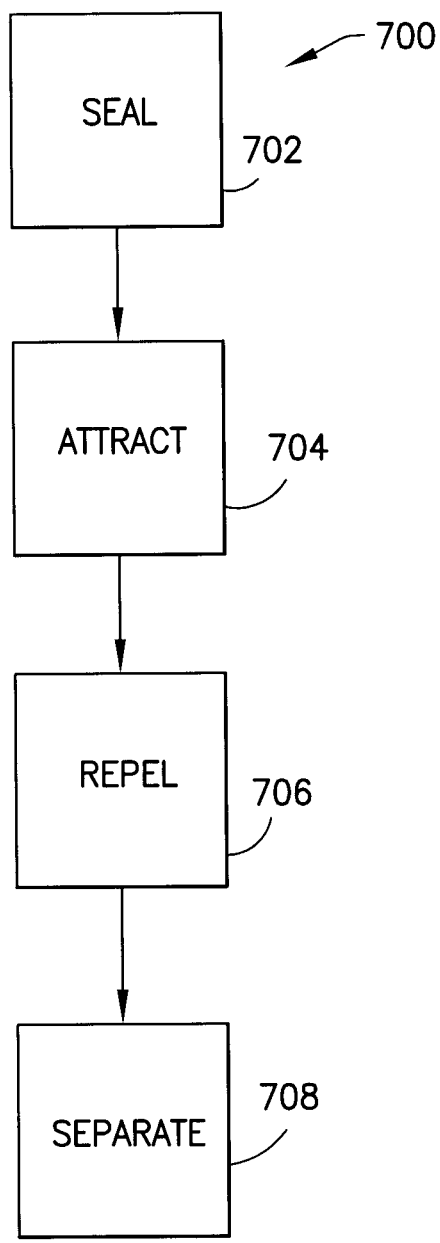
FIG. 32 shows a flow diagram.

Referring now to FIG. 32, there is shown flow diagram 700. Flow diagram 700 illustrates an exemplary method of separating a substrate from an adhering surface by providing 702 a seal and attracting 704 a surface of the substrate to the seal with an air bearing chuck having a vacuum region and a pressure region simultaneously acting on the surface of the substrate and without contacting the substrate with the air bearing chuck as previously described. Method 700 further provides repelling 706 the surface of the substrate from the seal with the pressure region of the air bearing chuck acting on the surface of the substrate and without contacting the substrate with the air bearing chuck. the surface of the substrate may be separated 708 from the seal with the pressure region of the air bearing chuck acting on the surface of the substrate and without contacting the substrate with the air bearing chuck is provided. In the exemplary method 700, the air bearing chuck may be axially moveable relative to the seal with a predetermined motion profile. In the exemplary method 700, the pressure region of the air bearing chuck may have a pressure gradient that increases lift at an outer edge of the air bearing chuck as compared to a center portion of the air bearing chuck. In the exemplary method 700, the air bearing chuck may be constrained to remain substantially parallel to a seal surface of the seal regardless of a de-stick propagation location between the substrate and the seal while the substrate is separating from the seal. Method 700 further provides separating 708 that may comprise moving the air bearing chuck from a first position to a second position relative to the seal by a force applied by a preloaded spring and damped between the air bearing chuck and the seal. In the exemplary method 700, the air bearing chuck may have an outer region that provides a stiffer air bearing interface between the substrate and the air bearing chuck as compared to the inner region. In alternate methods, more or less features in alternate sequence and with more or less structure may be provided.

In accordance with a first aspect of the disclosed embodiment a substrate chuck comprises a frame forming a support adapted to support an adhering surface thereon; and an air bearing surface coupled to the frame and adapted to support the substrate, the air bearing surface being axially moveable relative to the support. The air bearing surface has a first position adjacent the substrate with the substrate coupled to the adhering surface, and wherein the air bearing surface is moveable from the first position to a second position separating the substrate from the adhering surface without contact between the substrate and the air bearing surface.

In accordance with the first aspect of the disclosed embodiment wherein the air bearing surface has an air bearing region and a vacuum region.

In accordance with the first aspect of the disclosed embodiment wherein the air bearing surface is a substantially porous media.

In accordance with the first aspect of the disclosed embodiment wherein porosity at an outer region of the air bearing surface is larger than porosity at a an inner region of the air bearing surface.

In accordance with the first aspect of the disclosed embodiment wherein pressure supplied to an outer edge of the air bearing surface is larger than pressure supplied to a center of the air bearing surface.

In accordance with the first aspect of the disclosed embodiment wherein the air bearing surface is constrained to remain substantially parallel to the adhering surface.

In accordance with the first aspect of the disclosed embodiment wherein the air bearing surface has an air bearing pattern that is axisymmetric.

In accordance with the first aspect of the disclosed embodiment wherein the air bearing surface has an air bearing pattern that increases lift at an outer portion of the air bearing surface as compared to an inner portion of the air bearing surface.

In accordance with the first aspect of the disclosed embodiment wherein the air bearing surface is axially moveable relative to the support with a predetermined motion profile.

In accordance with a second aspect of the disclosed embodiment a mechanism adapted to separate a substrate from a sealing surface, the mechanism comprises a support structure adapted to grip the sealing surface; a moveable chuck positioned within the support structure so that it forms a retaining support structure for the movable chuck, the moveable chuck having a non-contact substrate clamping portion; and a controller configured for providing one or more predetermined combinations of air bearing pressure and partial vacuum caused by gas flow of the non-contact substrate clamping portion to generate a non-contact force on the substrate. The non-contact force overcomes adhesive forces between the sealing surface and the substrate, and wherein the non-contact force transports and positions the substrate with the moveable chuck.

In accordance with a second aspect of the disclosed embodiment wherein the non-contact substrate clamping portion has an air bearing region and a vacuum region.

In accordance with the second aspect of the disclosed embodiment wherein the non-contact substrate clamping portion is a substantially porous media.

In accordance with the second aspect of the disclosed embodiment wherein porosity at an outer region of the non-contact substrate clamping portion is larger than porosity at an inner region of the non-contact substrate clamping portion.

In accordance with the second aspect of the disclosed embodiment wherein pressure supplied to an outer edge of the non-contact substrate clamping portion is larger than pressure supplied to a central region of the non-contact substrate clamping portion.

In accordance with the second aspect of the disclosed embodiment wherein the moveable chuck is constrained to remain substantially parallel to the sealing surface.

In accordance with the second aspect of the disclosed embodiment wherein the non-contact substrate clamping portion has an air bearing pattern that is axisymmetric.

In accordance with the second aspect of the disclosed embodiment wherein the non-contact substrate clamping portion has an air bearing pattern that increases lift at an outer region of the non-contact substrate clamping portion as compared to an inner region of the non-contact substrate clamping portion.

In accordance with the second aspect of the disclosed embodiment wherein the non-contact substrate clamping portion is axially moveable relative to the retaining support structure with a predetermined motion profile.

In accordance with the second aspect of the disclosed embodiment wherein the support structure is movable so that the substrate held by the non-contact substrate clamping portion is movable between different positions wherein the substrate plane when at the different positions defines an angle therebetween.

In accordance with a third aspect of the disclosed embodiment a substrate chuck comprises a frame having a peripheral edge seal adapted to seal a peripheral edge of the substrate; and an air bearing chuck surface connected to the frame and adapted to support the substrate, the air bearing chuck surface and the peripheral edge seal being configured for relative movement therebetween from a first position with the substrate contacting the peripheral edge seal to a second position with the substrate not contacting the peripheral edge seal. The substrate is adhered to the peripheral edge seal when contacting the peripheral edge seal, and wherein the air bearing chuck surface effects separation of the substrate from the peripheral edge seal when transitioning from the first position to the second position, and wherein the air bearing chuck surface effects the separation of the substrate from the peripheral edge seal without the air bearing chuck surface contacting the substrate.

In accordance with the third aspect of the disclosed embodiment wherein the substrate is attracted to the peripheral edge seal and the air bearing chuck surface by suction of a vacuum region of the air bearing chuck surface when in the first position without the air bearing chuck surface contacting the substrate, and wherein the substrate floats on a cushion of gas of a pressure region on the air bearing chuck surface when in the second position without the air bearing chuck surface contacting the substrate.

In accordance with the third aspect of the disclosed embodiment wherein the air bearing chuck surface is axially moveable relative to the peripheral edge seal with a predetermined motion profile.

In accordance with the third aspect of the disclosed embodiment wherein the air bearing chuck surface has a pressure gradient that increases lift at an outer portion of the air bearing chuck surface as compared to a center portion of the air bearing chuck surface.

In accordance with the third aspect of the disclosed embodiment wherein the air bearing chuck surface is constrained to remain substantially parallel to a seal surface of the peripheral edge seal regardless of a de stick propagation location between the substrate and the peripheral edge seal while the substrate is separating from the peripheral edge seal.

In accordance with the third aspect of the disclosed embodiment wherein the air bearing chuck surface is moved from the first position to the second position by a force applied by a preloaded spring and damped between the air bearing chuck surface and the peripheral edge seal.

In accordance with the third aspect of the disclosed embodiment wherein the air bearing chuck surface has an outer annular region that provides a stiffer air bearing interface between the substrate and the air bearing chuck surface as compared to the inner annual region.

In accordance with a fourth aspect of the disclosed embodiment a method of separating a substrate from an adhering surface comprises providing a seal; attracting a surface of the substrate to the seal with an air bearing chuck having a vacuum region and a pressure region simultaneously acting on the surface of the substrate and without contacting the substrate with the air bearing chuck; repelling the surface of the substrate from the seal with the pressure region of the air bearing chuck acting on the surface of the substrate and without contacting the substrate with the air bearing chuck; and separating the surface of the substrate from the seal with the pressure region of the air bearing chuck acting on the surface of the substrate and without contacting the substrate with the air bearing chuck.

It should be understood that the foregoing description is only illustrative of the invention. Various alternatives and modifications can be devised by those skilled in the art without departing from the invention. Accordingly, the present invention is intended to embrace all such alternatives, modifications and variances.

What is claimed is:

1. A mechanism adapted to separate a substrate from a sealing surface, the mechanism comprising:
   a support structure adapted to grip the sealing surface;
   a moveable chuck positioned within the support structure so that it forms a retaining support structure for the movable chuck, the moveable chuck having a non-contact substrate clamping portion; and
   a controller configured for providing one or more predetermined combinations of air bearing pressure and partial vacuum caused by gas flow of the non-contact substrate clamping portion to generate a non-contact force on the substrate;
   wherein the non-contact force overcomes adhesive forces between the sealing surface and the substrate, and wherein the non-contact force transports and positions the substrate with the moveable chuck.

2. The mechanism of claim 1 wherein the non-contact substrate clamping portion has an air bearing region and a vacuum region.

3. The mechanism of claim 1 wherein the non-contact substrate clamping portion is a substantially porous media.

4. The mechanism of claim 1 wherein porosity at an outer region of the non-contact substrate clamping portion is larger than porosity at an inner region of the non-contact substrate clamping portion.

5. The mechanism of claim 1 wherein pressure supplied to an outer edge of the non-contact substrate clamping portion is larger than pressure supplied to a central region of the non-contact substrate clamping portion.

6. The mechanism of claim 1 wherein the moveable chuck is constrained to remain substantially parallel to the sealing surface.

7. The mechanism of claim 1 wherein the non-contact substrate clamping portion has an air bearing pattern that is axisymmetric.

8. The mechanism of claim 1 wherein the non-contact substrate clamping portion has an air bearing pattern that increases lift at an outer region of the non-contact substrate clamping portion as compared to an inner region of the non-contact substrate clamping portion.

9. The mechanism of claim 1 wherein the non-contact substrate clamping portion is axially moveable relative to the retaining support structure with a predetermined motion profile.

10. The mechanism of claim 1 wherein the support structure is movable so that the substrate held by the non-contact substrate clamping portion is movable between different positions wherein the substrate plane when at the different positions defines an angle therebetween.

* * * * *